(12) United States Patent
Tsuda et al.

(10) Patent No.: US 6,858,882 B2
(45) Date of Patent: Feb. 22, 2005

(54) NITRIDE SEMICONDUCTOR LIGHT-EMITTING DEVICE AND OPTICAL DEVICE INCLUDING THE SAME

(75) Inventors: Yuhzoh Tsuda, Tenri (JP); Shigetoshi Ito, Ikoma (JP); Kouichi Morishige, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 10/363,955

(22) PCT Filed: Sep. 4, 2001

(86) PCT No.: PCT/JP01/07664

§ 371 (c)(1),
(2), (4) Date: Aug. 1, 2003

(87) PCT Pub. No.: WO02/21604

PCT Pub. Date: Mar. 14, 2002

(65) Prior Publication Data

US 2004/0051105 A1 Mar. 18, 2004

(30) Foreign Application Priority Data

| Sep. 8, 2000 | (JP) | ......... | 2000-273195 |
| Dec. 1, 2000 | (JP) | ......... | 2000-366970 |

(51) Int. Cl.⁷ ............................................. H01L 33/00
(52) U.S. Cl. ........................ 257/103; 257/94; 257/96; 438/47; 372/43
(58) Field of Search ..................... 257/94, 96, 103; 372/43; 438/47

(56) References Cited

U.S. PATENT DOCUMENTS

| 5,932,896 A | 8/1999 | Sugiura et al. |
| 6,207,973 B1 | 3/2001 | Sato et al. |

FOREIGN PATENT DOCUMENTS

| JP | 09129920 | 5/1997 |
| JP | 10178201 | 6/1998 |
| JP | 10270804 | 10/1998 |
| JP | 11284282 | 10/1999 |
| JP | 2000031537 | 1/2000 |
| JP | 2000068555 | 3/2000 |
| JP | 2000124500 | 4/2000 |
| JP | 2000133840 | 5/2000 |
| JP | 2000183399 | 6/2000 |
| JP | 2000232239 | 8/2000 |
| JP | 05121327 | 5/2003 |
| WO | WO 00/16383 | 3/2000 |

OTHER PUBLICATIONS

Borchert, B. et al. (1999) "1.29μm GaInNAs Multiple Quantum-well Ridge-waveguide Laser Diodes with Improved Performance," *Electronics Letters* 35(25):2204–2206.

*Primary Examiner*—Sara Crane
(74) *Attorney, Agent, or Firm*—Morrison & Foerster LLP

(57) ABSTRACT

A nitride semiconductor light-emitting device includes an emission layer (103) formed on a substrate (100), and the emission layer includes a quantum well layer of $GaN_{1-x-y-z}As_xP_ySb_z$ ($0 < x+y+z \leq 0.3$) containing Al.

27 Claims, 15 Drawing Sheets

NITRIDE SEMICONDUCTOR LIGHT-EMITTING DEVICE AND OPTICAL DEVICE INCLUDING THE SAME

CROSS-REFERENCE TO RELATED APPLICATIONS

This application is a National Phase under 35 U.S.C. §371 of International Application No. PCT/JP01/07664 filed on Sep. 4, 2001 which claims priority to Japanese Patent Application No. 2000-366970 filed on Dec. 1, 2000, and Japanese Patent Application No. 2000-273195 filed on Sep. 8, 2000, the contents of each of which are incorporated herein by reference in their entirety.

TECHNICAL FIELD

The present invention relates to a nitride semiconductor light-emitting device having high luminous efficiency and an optical device utilizing the same.

BACKGROUND ART

In general, a nitride semiconductor is utilized or studied for a light-emitting device or a high-power semiconductor device. In the case of the nitride semiconductor light-emitting device, a quantum well layer emitting light in an emission layer is made of InGaN containing indium, and light-emitting devices for a wide color range from blue to orange can be prepared by varying the In content. In recent years, a blue or green light-emitting diode or a bluish purple semiconductor laser has been developed utilizing the characteristics of the nitride semiconductor light-emitting device. Japanese Patent Laying-Open 10-270804 reports a light-emitting device including an emission layer containing a GaNAs well layer/a GaN barrier layer.

In the case of preparing a light-emitting device utilizing an InGaN quantum well layer, however, the chemical thermal equilibrium state of the InGaN layer is so unstable that it is difficult to form an emission layer having excellent crystallinity. Particularly in the case of growing an InGaN crystal layer containing In of at least 15% in the group III elements, the InGaN crystal is readily phase-separated into regions having high and low In contents respectively depending on its growth temperature (this phenomenon is hereinafter referred to also as concentration separation). Such concentration separation causes reduction of luminous efficiency and increase of the half-width of the emission wavelength (color heterogeneity).

On the other hand, a GaNAs well layer (As is at least partially replaceable with P and/or Sb) containing no In does not cause the aforementioned problem of concentration separation, but causes phase separation containing different crystal systems (separation of a hexagonal system and a cubic system) due to As etc. contained therein, and such crystal system separation causes reduction of crystallinity and luminous efficiency of the well layer.

Accordingly, a principal object of the present invention is to improve luminous efficiency of a nitride semiconductor light-emitting device including an emission layer containing a quantum well of nitride semiconductor by improving crystallinity and suppressing phase separation of the quantum well layer.

DISCLOSURE OF THE INVENTION

A nitride semiconductor light-emitting device according to an aspect of the present invention includes an emission layer formed on a substrate, and this emission layer includes a single quantum well layer of $GaN_{1-x-y-z}As_xP_ySb_z$ ($0<x+y+z\leq0.3$) containing Al.

The substrate preferably is formed with a nitride semiconductor, and may also be a pseudo GaN substrate. The etch pit density of the substrate corresponding to threading dislocation density is preferably not more than $7\times10^7/cm^2$.

The single quantum well layer preferably contains Al in concentration of at least $6\times10^{18}/cm^3$, and preferably has a thickness of at least 0.4 nm and not more than 20 nm. The well layer preferably contains a dopant of at least any of Si, O, S, C, Ge, Zn, Cd and Mg, and the dopant concentration is preferably in a range of $1\times10^{16}/cm^3$ to $1\times10^{20}/cm^3$.

According to another aspect of the present invention, a nitride semiconductor light-emitting device includes an emission layer having a multiple quantum well structure obtained by alternately stacking a plurality of quantum well layers and a plurality of barrier layers on a substrate, the quantum well layers is formed with $GaN_{1-x-y-z}As_xP_ySb_z$ ($0\leq x\leq0.10$, $0\leq y\leq0.16$, $0\leq z\leq0.04$, $x+y+z>0$) and additionally contain at least Al, and the barrier layers formed with nitride semiconductor.

GaN is preferably employable as the substrate material. The emission layer causing action of emitting light includes the quantum well layers and the barrier layers, and the quantum well layers have a smaller energy band gap as compared with the barrier layers.

The Al content of the well layers is preferably at least $1\times10^{19}/cm^3$. The barrier layers preferably contain any element selected from As, P and Sb.

The emission layer preferably includes at least 2 and not more than 10 well layers. The quantum well layers each preferably have a thickness of at least 0.4 nm and not more than 20 nm. The barrier layers each preferably have a thickness of at least 1 nm and not more than 20 nm.

The nitride semiconductor light-emitting device preferably includes a substrate, and at least either a first adjacent semiconductor layer in contact with a first main surface, included in both main surfaces of the emission layer, closer to the substrate or a second adjacent semiconductor layer in contact with a second main surface farther from the substrate preferably formed with a nitride semiconductor containing Al.

At least any dopant of Si, O, S, C, Ge, Zn, Cd and Mg is preferably added to at least either the well layers or the barrier layers. A content of such a dopant is preferably in a range of $1\times10^{16}$ to $1\times10^{20}/cm^3$.

The aforementioned nitride semiconductor light-emitting device is preferably employable in various optical devices such as an optical information reader, an optical information writer, an optical pickup, a laser printer, a projector, a display and a white light source.

BEST MODE FOR CARRYING OUT THE INVENTION

Figure 1:
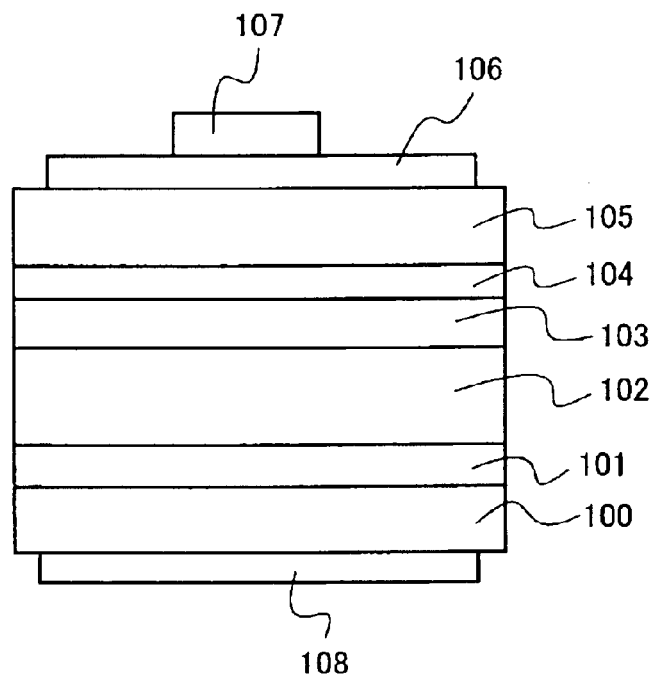
FIG. 1 is a schematic sectional view showing structure of a nitride semiconductor diode device according to Embodiment of the present invention.

Generally in the case of growing a nitride semiconductor crystal layer, it is possible to use a substrate of GaN, sapphire or the like, and similarly possible to use another nitride semiconductor substrate such as of $Al_aGa_bIn_cN$ ($0 \leq a \leq 1$, $0 \leq b \leq 1$, $0 \leq c \leq 1$, $a+b+c=1$). The nitrogen element in this substrate may be replaced with As, P or Sb in a range of not more than about 10% thereof (on condition that the hexagonal system is maintained). In the case of a nitride semiconductor laser, a couple of layers having a lower refractive index than a couple of cladding layers sandwiching an emission layer must be in contact with the outer side of the cladding layers in order to render a vertical transverse mode unimodal, and then an AlGaN substrate is preferably employed. Further, the substrate may be doped with Si, O, Cl, S, C, Ge, Zn, Cd, Mg or Be. Among these doping agents, Si, O and Cl are particularly preferable for an n-type nitride semiconductor substrate.

While the following Embodiments are described with reference to a C-plane {0001} substrate of sapphire or a nitride semiconductor, an A plane {11-20}, an R plane {1-102} or an M plane {1-100} may also be employed as the plane orientation forming the main surface of the substrate in place of the C plane. In the case that a substrate has an off-angle within 2 degrees from such plane orientation, surface morphology of a semiconductor crystal layer grown thereon is improved.

The crystal layer is generally grown by metal organic chemical vapor deposition (MOCVD), molecular beam epitaxy (IBE), hydride vapor phase epitaxy (HVPE) or the like.

The conventional GaNAs well layer disclosed in Japanese Patent Laying-Open 10-270804 contains no In and hence causes no phase separation due to In. However, the well layer containing As causes crystal system separation, and thus causes reduction of crystallinity and reduction of luminous efficiency in a finally obtained nitride semiconductor light-emitting device.

This crystal system separation possibly occurs not only in the GaNAs well layer but also in a GaNP well layer or a GaNSb well layer. Thus, it is conceivable that crystal system separation of a well layer is caused by containing As, P or Sb.

This crystal system separation conceivably results from that As, P and Sb are more adherent to Ga as compared with N and that N has extremely high volatility as compared with As, P and Sb (N escapes from the crystal). In a step of supplying a raw material for Ga and a raw material for N for vapor phase epitaxy of a GaN crystal, part of the supplied N material is partially bonded to the Ga material to form the GaN crystal on the outermost surface (epitaxial growth surface) of the GaN crystal, while most part thereof conceivably re-evaporates due to the high volatility of N.

On the other hand, Ga having not incorporated in the GaN crystal due to the re-evaporation of N momentarily diffuses on the epitaxial growth surface and thereafter re-evaporates. If a raw material for As, P or Sb is supplied in addition to the N material, however, the remaining Ga readily adsorbs to As, P or Sb while diffusing on the epitaxial growth surface. This is because the adherent of As, P or Sb to Ga is much higher with respect to N. Thus, bonds of Ga—As, Ga—P or Ga—Sb are conceivably formed with high probability. Further, the surface migration length of Ga is so large that there is high probability that the bonds of Ga—As, Ga—P or Ga—Sb encounter each other, and these bonds can be fixed and crystallized upon these encounters. Thus, the aforementioned segregation effect may conceivably occur. If the degree of this segregation effect increases, it finally causes separation into regions (cubic system) having a high bonding ratio of Ga—As, Ga—P or Ga—Sb and regions (hexagonal system) having a low bonding ratio. This is conceivably the crystal system separation. In order to reduce this crystal system separation, therefore, it is important to efficiently incorporate N into the crystals.

Embodiment 1

In a nitride semiconductor light-emitting device according to Embodiment 1 of the present invention, it is possible to reduce crystal system separation by introducing Al into a single quantum layer of $GaN_{1-x-y-z}As_xP_ySb_z$ (where $0<x+y+z \leq 0.3$) included in an emission layer, as hereinafter described. This is conceivably because Al having extremely high reactivity with respect to N as compared with Ga acts to prevent N from escaping from the well layer. Further, the surface migration length of Al is short as compared with that of Ga and hence the aforementioned remarkable segregation effect is conceivably not caused even if Al is bonded to As, P or Sb. Thus, it is conceivably possible to reduce crystal system separation by adding Al into the $GaN_{1-x-y-z}As_xP_ySb_z$ single well layer (where $0<x+y+z \leq 0.3$).

As to Composition Ratio of As, P or Sb in Single Well Layer

The total composition ratio $x+y+z$ of As, P and Sb in the $AlGaN_{1-x-y-z}As_xP_ySb_z$ single well layer in the nitride semiconductor light-emitting device is preferably set to at least 0.01% and not more than 30%, and more preferably at least 0.1% and not more than 10%. If the composition ratio x+y+z is smaller than 0.01%, it is difficult to attain improvement of luminous intensity by introducing As, P or Sb into the single well layer. If the composition ratio x+y+z is higher than 30%, on the other hand, it is difficult to reduce crystal system separation caused by As, P or Sb even if Al is added to the single well layer. If the composition ratio x+y+z is at least 0.1% and not more than 10%, the effect caused by adding Al can be attained sufficiently.

As to Thickness of Single Well Layer

While a preferred thickness of the $Al_aGa_{1-a}N_{1-x-y-z}As_xP_ySb_z$ ($0<x+y+z\leq0.3$) single well layer depends on the Al composition ratio a, it is possible to thickly grow the layer to a thickness of about 100 nm in the case of satisfying the average composition ratio ($0<x+y+z\leq0.3$) of As, P or Sb. This is conceivably because the crystal system separation is reduced due to the average composition ratio. In consideration of the light-emitting device, however, an effective thickness of the single well layer is preferably in a range of at least 0.4 nm and not more than 20 nm. If the thickness of the single well layer is less than 0.4 nm, there is a possibility that a carrier confinement energy level caused by the quantum well effect becomes so high that the luminous efficiency is reduced. If the thickness of the single well layer exceeds 20 nm, on the other hand, there is a possibility that electric resistance of the device is increased.

As to Al Content of Single Well Layer

Figure 6:
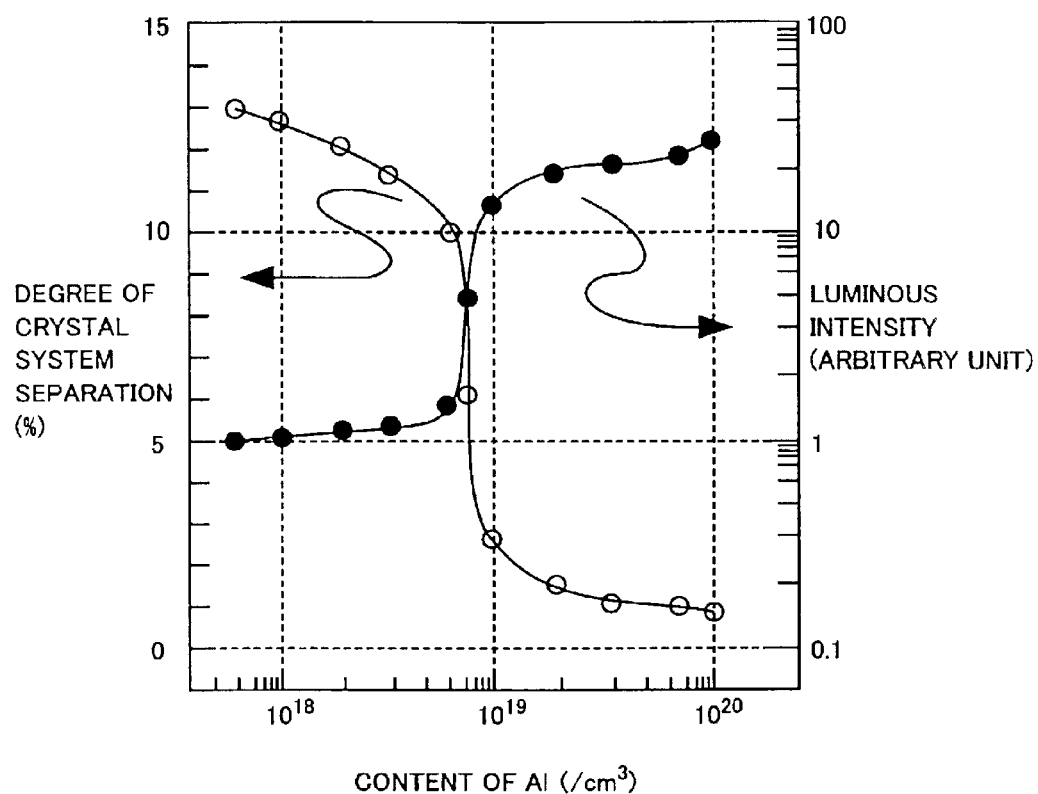
FIG. 6 is a graph showing influence exerted by Al content in a quantum well layer on the degree of the crystal system separation and the luminous intensity.

FIG. 6 illustrates influence exerted by Al addition into a $GaN_{0.92}P_{0.08}$ single well layer on the degree of crystal system separation and luminous intensity. Referring to FIG. 6, the horizontal axis shows the Al content in the well layer, the left vertical axis shows the degree (%) of crystal system separation and the right vertical axis shows the luminous intensity. The luminous intensity in FIG. 6 is normalized with reference to the luminous intensity obtained when no Al is added. The degree of crystal system separation expresses the volume fraction of a portion causing crystal system separation in the unit volume of the well layer.

As understood from FIG. 6, the degree (%) of crystal system separation starts to decrease when the Al content is increased from around $6\times10^{18}/cm^3$, and reaches a level of not more than 3% when the Al content exceeds $1\times10^{19}/cm^3$. On the other hand, the luminous intensity starts to increase when the Al content is increased from around $6\times10^{18}/cm^3$, and reaches a level of at least 10 times when the Al content exceeds $1\times10^{19}/cm^3$. From these relative facts, there is conceivably correlation between the crystal system separation and the luminous intensity.

From the above, the degree of crystal system separation is preferably not more than 6%, and more preferably not more than 3%, in order to obtain a single well layer having high luminous intensity (high luminous efficiency). In order to obtain such a degree of crystal system separation, the Al content is preferably at least $6\times10^{18}/cm^3$, and more preferably at least $1\times10^{19}/cm^3$.

The upper limit of the Al content is preferably not more than 0.2 (corresponding to a content of not more than $8.8\times10^{21}/cm^3$) when expressed by the Al composition ratio a in the $Al_aGa_{1-a}N_{1-x-y-z}As_xP_ySb_z$ single well layer, and more preferably not more than 0.1 (corresponding to a content of not more than $4.4\times10^{21}/cm^3$). In this case, the composition ratio of As, P or Sb must be $0<x+y+z\leq0.3$. If the composition ratio a of Al exceeds 20%, crystallinity of the single well layer is so reduced that the luminous efficiency is undesirably reduced. If the composition ratio a of Al is not more than 10%, the operating voltage of the device can be preferably reduced.

While FIG. 6 shows the case of adding Al into the $GaN_{0.92}P_{0.08}$ crystal, it is possible to cause a tendency similar to that shown in FIG. 6 also when Al is added into $GaN_{1-x-y-z}As_xP_ySb_z$ ($0<x+y+z\leq0.3$) crystals.

As to Emission wavelength of Single Well Layer

In the $Al_aGa_{1-a}N_{1-x-y-z}As_xP_ySb_z$ ($0<x+y+z\leq0.3$) single well layer, a target emission wavelength can be obtained by mainly adjusting the composition ratio of As, P or Sb.

In order to obtain an emission wavelength in the vicinity of 380 nm of the ultraviolet when Al is added at a doping level (i.e., the Al composition ratio of the single well layer is less than 1%) as shown in FIG. 6, for example, x may be equal to 0.05 in the case of $AlGaN_{1-x}As_x$, y may be equal to 0.01 in the case of $AlGaN_{1-y}P_y$, and z may be equal to 0.02 in the case of $AlGaN_{1-z}Sb_z$. In order to obtain an emission wavelength in the vicinity of 410 nm of bluish-purple, x may be equal to 0.02 in the case of $AlGaN_{1-x}As_x$, y may be equal to 0.03 in the case of $AlGaN_{1-y}P_y$, and z may be equal to 0.01 in the case of $AlGaN_{1-z}Sb_z$. In order to obtain a wavelength in the vicinity of 470 nm of blue, further, x may be equal to 0.03 in the case of $AlGaN_{1-x}As_x$, y may be equal to 0.06 in the case of $AlGaN_{1-y}P_y$, and z may be equal to 0.02 in the case of $AlGaN_{1-z}Sb_z$. In order to obtain a wavelength in the vicinity of 520 nm of green, still further, x may be equal to 0.05 in the case of $AlGaN_{1-x}As_x$, y may be equal to 0.08 in the case of $AlGaN_{1-y}P_y$, and z may be equal to 0.03 in the case of $AlGaN_{1-z}Sb_z$. In order to obtain a wavelength in the vicinity of 650 nm of red, still further, x may be equal to 0.07 in the case of $AlGaN_{1-x}As_x$, y may be equal to 0.12 in the case of $AlGaN_{1-y}P_y$, and z may be equal to 0.04 in the case of $AlGaN_{1-z}Sb_z$. In preparing the single well layer in the vicinity of the aforementioned composition ratio, it is possible to substantially obtain a target emission wavelength.

When Al is added at a composition ratio level (i.e., the Al composition ratio is at least 1%), the composition ratio of As, P or Sb may be adjusted to be relatively high. Tables 1 and 2 show specific relation between the composition ratio of As or P and the emission wavelength. Table 1 shows the relation between the Al composition ratio (a) and the As composition ratio (x) for obtaining a target emission wavelength with an $Al_aGa_{1-a}N_{1-x}As_x$ single well layer. Table 2 shows the relation between the Al composition ratio (a) and the P composition ratio (y) for obtaining a target emission wavelength with an $Al_aGa_{1-a}N_{1-y}P_y$ single well layer. The composition ratio of Sb is preferably not more than 0.04. This is because the crystallinity is remarkably reduced if the composition ratio of Sb is higher than 0.04.

TABLE 1

| | | $Al_aGa_{1-a}N_{1-x}As_x$ | | | | | |
|---|---|---|---|---|---|---|---|
| | | a = 0.01 | a = 0.02 | a = 0.03 | a = 0.05 | a = 0.1 | a = 0.2 |
| Emission Wavelength | 380 nm | 0.01 | 0.01 | 0.01 | 0.01 | 0.02 | 0.03 |
| | 400 nm | 0.01 | 0.02 | 0.02 | 0.02 | 0.02 | 0.04 |
| | 410 nm | 0.02 | 0.02 | 0.02 | 0.02 | 0.03 | 0.04 |
| | 470 nm | 0.04 | 0.04 | 0.04 | 0.04 | 0.05 | 0.06 |
| | 520 nm | 0.05 | 0.05 | 0.05 | 0.05 | 0.06 | 0.07 |
| | 650 nm | 0.07 | 0.07 | 0.07 | 0.08 | 0.08 | 0.10 |

TABLE 2

| | | $Al_aGa_{1-a}N_{1-y}P_y$ | | | | | |
|---|---|---|---|---|---|---|---|
| | | a = 0.01 | a = 0.02 | a = 0.03 | a = 0.05 | a = 0.1 | a = 0.2 |
| Emission Wavelength | 380 nm | 0.01 | 0.01 | 0.01 | 0.02 | 0.03 | 0.04 |
| | 400 nm | 0.02 | 0.02 | 0.03 | 0.03 | 0.04 | 0.06 |
| | 410 nm | 0.03 | 0.03 | 0.03 | 0.04 | 0.04 | 0.06 |
| | 470 nm | 0.06 | 0.06 | 0.06 | 0.07 | 0.07 | 0.10 |
| | 520 nm | 0.08 | 0.08 | 0.08 | 0.09 | 0.10 | 0.12 |
| | 650 nm | 0.12 | 0.12 | 0.12 | 0.13 | 0.14 | 0.16 |

As to Substrate for Growing Light-Emitting Device Including Single Well Layer

The inventors have found that luminous intensity of a light-emitting device including a single well layer varies with a substrate for growing the single well layer. This is conceivably because crystal defect density in the light-emitting device varies with the substrate and the surface migration length of Al is so short that Al is readily trapped in the vicinity of crystal defects. Consequently, it is conceivable that the effect of reducing crystal system separation by adding Al is attained only in the vicinity of crystal defects and it is impossible to sufficiently attain the reductive effect on the overall substrate.

According to recognition by the inventors, the luminous intensity is strong when a light-emitting device including a single well layer is grown on a nitride semiconductor substrate, i.e., the nitride semiconductor substrate is the most preferable substrate. For example, the etch pit density of a nitride semiconductor film grown on a GaN substrate is not more than about $5 \times 10^7/cm^2$. This is a value smaller than the etch pit density (at least about $4 \times 10^8/cm^2$) of a nitride semiconductor film on a sapphire substrate or an SiC substrate (substrate other than the nitride semiconductor substrate) used as the substrate for a conventional nitride semiconductor light-emitting device. The etch pit density is obtained by dipping an epi-wafer (light-emitting device) for 10 minutes in an etching solution (temperature: 250° C.) containing phosphoric acid and sulfuric acid in the ratio 1:3 and measuring the density of pits formed on the surface of the wafer. In this case, the pit density on the surface of the epi-wafer is measured as the etch pit density, and hence no crystal defect density of the well layer is measured in a strict sense. When the etch pit density is high, however, crystal defect density in the well layer is also increased in proportion thereto, and hence measurement of the etch pit density can be regarded as the index as to whether or not the well layer contains a large number of crystal defects.

A substrate preferable subsequently to the nitride semiconductor substrate is a pseudo GaN substrate. A method of manufacturing a pseudo GaN substrate is described in detail in Embodiment 2. The etch pit density of a nitride semiconductor film grown on the pseudo GaN substrate is not more than about $7 \times 10^7/cm^2$ in a region of the smallest etch pit density. This is a value close to the etch pit density of the nitride semiconductor film grown on the GaN substrate. However, the pseudo GaN substrate, including regions of low etch pit density and regions of high etch pit density in a mixed state, tends to reduce the yield of the light-emitting devices as compared with the GaN substrate (exemplary nitride semiconductor substrate). On the other hand, the pseudo GaN substrate has such an advantage as that a substrate having a larger area than the nitride semiconductor substrate can be manufactured at a low cost.

As to Addition of Impurity to Single Well Layer

According to photoluminescence (PL) measurement by the inventors, PL luminous intensity is strengthened to about 1.2 times when Si is added into the single well layer. In other words, luminous intensity of the light-emitting device can be improved by adding an impurity to the single well layer. This is conceivably for the following reason. In the single well layer according to the present invention, it is possible to effectively reduce the crystal system separation by adding Al. However, Al is conceivably readily trapped in the vicinity of defects in the crystal, since Al has a shorter surface migration length on an epitaxial growth surface as compared with Ga. Consequently, the effect of suppressing crystal system separation can act mainly in the vicinity of crystal defects.

Therefore, the impurity of Si is preferably added into the single well layer. The impurity is homogeneously distributed on the overall surface of the epitaxial growth film, and forms nuclei for crystal growth. These nuclei thinkably have action of trapping Al similarly to the crystal defects. Further, these nuclei are homogeneously distributed on the overall surface of the epitaxial growth film dissimilarly to the crystal defects, to conceivably cause action of homogeneously distributing Al on the overall single well layer. Thus, the effect of reducing crystal system separation conceivably occurs efficiently to result in improvement of the luminous intensity. Particularly in a light-emitting device including a single well layer grown on a substrate such as a sapphire substrate, for example, other than a nitride semiconductor substrate, the effect resulting from addition of the impurity is remarkable with a large number of crystal defects (etch pit density: at least $4 \times 10^8/cm^2$).

It is possible to attain a similar effect also when an impurity of at least one of O, S, C, Ge, Zn, Cd and Mg is added in place of Si. A content of the impurity is preferably in a range of $1 \times 10^{16}/cm^3$ to $1 \times 10^{20}/cm^3$. When the content of the impurity is smaller than $1 \times 10^{16}/cm^3$, no improvement of the luminous intensity of the light-emitting device is attained. When the content of the impurity is larger than $1 \times 10^{20}/cm^3$, on the other hand, the crystallinity is undesirably deteriorated (the luminous efficiency is reduced).

Light-Emitting Diode Device Including Single Well Layer

FIG. 1 shows an exemplary nitride semiconductor light-emitting diode device including a single well layer as a schematic sectional view. This diode device includes an n-type GaN substrate 100 having a C plane (0001) as the main surface, a GaN buffer layer 101 (thickness: 100 nm) formed at a relatively low temperature, an n-type GaN layer 102 (thickness: 3 μm, Si impurity concentration: $1 \times 10^{18}/cm^3$), a single well layer 103, a p-type $Al_{0.1}Ga_{0.9}N$ carrier blocking layer 104 (thickness: 20 nm, Mg impurity concentration: $6 \times 10^{19}/cm^3$), a p-type GaN contact layer 105 (thickness: 0.1 μm, Mg impurity concentration: $1 \times 10^{20}/cm^3$), an optically transparent electrode 106, a p electrode 107 and an n electrode 108.

In formation of the diode device shown in FIG. 1, the n-type GaN substrate 100 is first set in an MOCVD (metal organic chemical vapor deposition) apparatus to grow the GaN buffer layer 101 to a thickness of 100 nm at a relatively low substrate temperature of 550° C. with $NH_3$ (ammonia) as a raw material for a group V element and TMGa (trimethyl gallium) as a raw material for a group III element. Then, $SiH_4$ (silane) is added to the $NH_3$ and TMGa at a substrate temperature of 1050° C. to form the n-type GaN layer 102 (Si impurity concentration: $1 \times 10^{18}/cm^3$) to a thickness of 3 µm. Thereafter, the substrate temperature is reduced to 800° C., to grow the $Al_{0.01}Ga_{0.99}N_{0.92}P_{0.08}$ single well layer 103 of 4 nm thickness. At this time, $SiH_4$ (Si impurity concentration: $1\times10^{18}/cm^3$) is added to the single well layer.

Then, the substrate is heated to 1050° C. again to grow the p-type $Al_{0.01}Ga_{0.09}N$ carrier blocking layer 104 of 20 nm thickness and the p-type GaN contact layer 105 of 0.1 µm thickness. $EtCP_3Mg$ (bisethylcyclopentadienyl magnesium) is added with an Mg concentration in a range of $5\times10^{19}/cm^3$ to $2\times10^{20}/cm^3$ as the p-type impurity. The p-type impurity concentration in the p-type GaN contact layer 105 is preferably increased as approaching the surface on which the optically transparent electrode 106 is to be formed. This is because contact resistance of the p electrode can thereby be reduced while suppressing increase of crystal defects resulting from addition of the impurity. A small quantity of oxygen may be mixed during growth of the p-type layers in order to remove residual hydrogen acting to hinder activation of Mg in the p-type layers.

After growing the p-type GaN contact layer 106, gas in the reaction chamber of the MOCVD apparatus is replaced with nitrogen and $NH_3$, and the substrate temperature is reduced at a rate of 60° C./min. Supply of $NH_3$ is stopped when the substrate temperature is reduced to 800° C., and the substrate is held at this temperature for 5 minutes and thereafter cooled to the room temperature. The temperature for holding the substrate is preferably in a range of 650° C. to 900° C., and the holding time is preferably in a range of at least 3 minutes and not more than 10 minutes. The temperature reduction rate from the holding temperature is preferably at least 30° C./min. As a matter of fact, according to a result of Raman measurement, the film grown in the above manner already exhibited the p-type property (Mg was activated), even though the same was not subjected to the conventional annealing for activating the p-type impurity. Contact resistance after formation of the p electrode (described in detail later) was also reduced, even though the conventional annealing for activating the p-type impurity was not carried out. Of course, however, if the conventional annealing for activating the p-type impurity is carried out, the activation ratio of Mg is further improved.

Then, the epi-wafer is taken out from the MOCVD apparatus, and the electrodes are formed thereon. In this Embodiment, the n-type GaN substrate 100 is employed and hence the n electrode 108 is formed in order of Hf/Au on the back surface thereof. In place of this n electrode material, Ti/Al, Ti/Mo or Hf/Al may also be employed. Particularly when Hf is employed for the n electrode, the contact resistance of the electrode is preferably reduced. In formation of the p electrode, a Pd film having an extremely small thickness of 7 nm is deposited as the optically transparent electrode 106, and an Au film is deposited as the p electrode 107. In place of the optically transparent electrode material, Ni, Pd/Mo, Pd/Pt, Pd/Au or Ni/Au, for example, may also be employed.

Finally, the chip is obtained by division using a scriber on the back surface (surface of the deposited n electrode 108) of the n-type GaN substrate 100. Scribing is carried out from the back surface of the substrate so that no shavings resulting from scribing adheres to the optically transparent electrode for extracting light. In relation to the direction of scribing, the chip is so divided that at least a side of each device chip includes the cleavage plane of the nitride semiconductor substrate. Therefore, the chip is prevented from abnormality in shape resulting from chipping or cracking and thus the yield of device chips per wafer is improved.

In this Embodiment, the low-temperature buffer layer 101 may be of $Al_xGa_{1-x}N$ ($0\leq x\leq 1$), and this buffer layer may be omitted. However, surface morphology of a currently available GaN substrate is not satisfactory and hence it is more preferable to provide the $Al_xGa_{1-x}N$ buffer layer ($0\leq x\leq 1$) so that the surface morphology is improved. The term "low-temperature buffer layer" denotes a buffer layer formed at a relatively low growth temperature of 450° C. to 600° C. The buffer layer formed in such a low growth temperature range is polycrystalline or amorphous.

While the single well layer 103 in this Embodiment is provided in contact between the n-type GaN layer 102 and the p-type $Al_{0.1}Ga_{0.9}N$ carrier blocking layer 104, a first new intermediate layer may be provided between the n-type GaN layer 102 and the single well layer 103. Similarly, a second new intermediate layer may be provided between the single well layer 103 and the p-type $Al_{0.1}Ga_{0.9}N$ carrier blocking layer 104. In this case, the refractive indices of these layers are set in the relation of the single well layer>the first intermediate layer>the n-type GaN layer and the relation of the single well layer>the second intermediate layer>the p-type AlGaN carrier blocking layer. Thus, the single well layer can efficiently confine light so that the light-emitting diode can be applied to a super-luminescent diode or a graded-index separate confinement heterostructure laser, for example. Although the impurity (Si) is added at concentration of $1\times10^{18}/cm^3$ to the single well layer 103 in this Embodiment, it may be omitted.

In the p-type $Al_{0.1}Ga_{0.9}N$ carrier blocking layer 104, the composition ratio of Al may be other than 0.1. When this Al composition ratio is increased, the carrier confinement effect in the single well layer is preferably strengthened. When the Al composition ratio is reduced within a range holding the carrier confinement effect, on the other hand, carrier mobility in the carrier blocking layer is increased to preferably reduce the electric resistivity. Further, the carrier blocking layer 104 containing Al can prevent the element of As, P or Sb contained in the single well layer from diffusing into the p-type GaN contact layer 105. Thus, it is possible to prevent the emission wavelength of the light-emitting device from deviating from the designed value. The material for the carrier blocking layer 104 is not restricted to the ternary mixed crystal of AlGaN but may alternatively be a quaternary mixed crystal of AlInGaN, AlGaNP or AlGaNAs.

Figure 4:
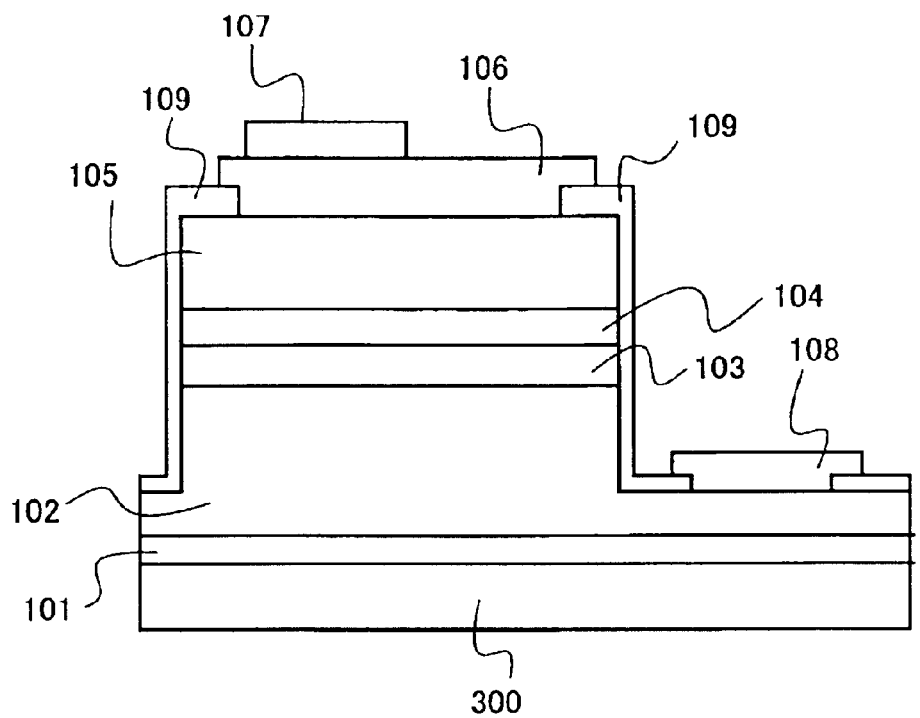
FIG. 4 is a schematic sectional view of a light-emitting diode device according to another Embodiment.

Although the n electrode 108 in this Embodiment is formed on the back surface of the n-type GaN substrate 100, alternatively the n-type GaN layer 102 may be partially exposed from the p electrode side of the epi-wafer by dry etching or the like to form the n electrode on the exposed part (see FIG. 4, for example).

While the C plane (0001) of the GaN substrate is utilized in this Embodiment, a C plane (000-1), an A plane {11-20}, an R plane {1-102}, an M plane {1-100} or a {1-101} plane may alternatively be employed as the main surface orientation of the substrate in place of the C plane. If the substrate surface has an off-angle of within 2 degrees from the plane orientation, the surface morphology is preferably improved. Further, the GaN substrate may be replaced with another nitride semiconductor substrate.

While this Embodiment has been described with reference to a crystal growth method employing an MOCVD apparatus, molecular beam epitaxy (MBE) or hydride vapor phase epitaxy (HVPE) may alternatively be employed.

Embodiment 2

Figure 2:
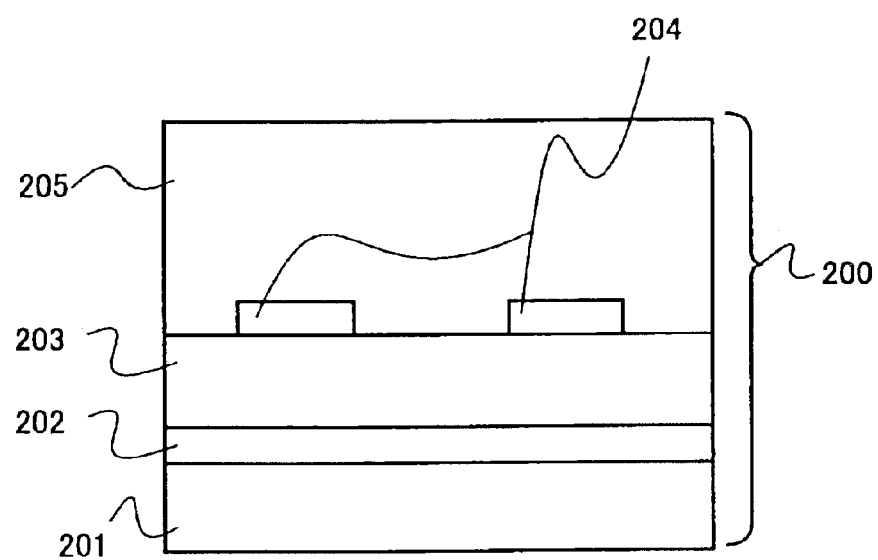
FIG. 2 is a schematic sectional view showing an exemplary pseudo GaN substrate.
Figure 3A:
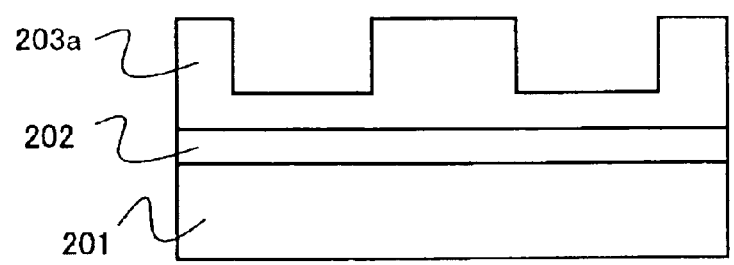
FIGS. 3A and 3B are schematic sectional views for illustrating a process of manufacturing the pseudo GaN substrate.
Figure 3B:
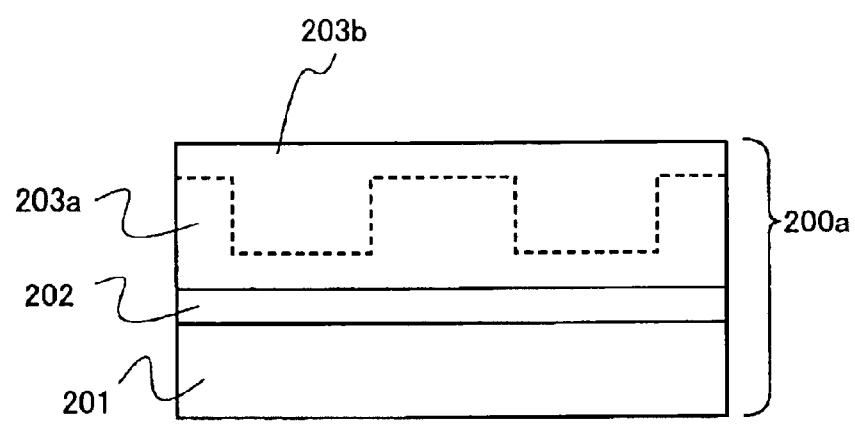

Embodiment 2 is different from Embodiment 1 only in a point that the GaN substrate 100 of FIG. 1 is replaced with a pseudo GaN substrate 200 of FIG. 2 or a pseudo GaN substrate 200a of FIG. 3B while a p electrode and an n electrode are formed on the same side of the substrate as shown in FIG. 4.

The pseudo GaN substrate 200 shown in FIG. 2 includes a seed substrate 201, a low-temperature buffer layer 202, an n-type GaN layer 203, a growth inhibitor film 204 and an n-type GaN thick film 205.

The seed substrate 201 is used as a base for growing the n-type GaN thick film 205. The term "growth inhibitor film" denotes a film on which no nitride semiconductor layer grows directly. The pseudo GaN substrate is not restricted to the structure shown in FIG. 2 but this term denotes a substrate including at least a seed substrate and a growth inhibitor film.

The pseudo GaN substrate 200a shown in FIG. 3B includes a seed substrate 201, a low-temperature buffer layer 202, a first n-type GaN film 203a and a second n-type GaN film 203b. FIG. 3A shows an intermediate step for preparing the pseudo GaN substrate 200a.

When the pseudo GaN substrate 200a is prepared, the first n-type GaN film 203a is stacked and thereafter the surface of the GaN film 203a is worked to form trenches by dry etching or wet etching. Thereafter the wafer is introduced into a crystal growth apparatus again for stacking the second n-type GaN film 203b and completing the pseudo GaN substrate 200a (see FIG. 3B). Although the trenches is formed to only an intermediate depth of the first n-type GaN film 203a in FIG. 3A, it may alternatively be formed to a depth reaching the low-temperature buffer layer 202 or the seed substrate 201.

When a nitride semiconductor film is grown on the pseudo GaN substrate 200 or 200a prepared in the aforementioned manner, the crystal defect density of the nitride semiconductor film is low as compared with that grown directly on a sapphire substrate or an SiC substrate. When the pseudo GaN substrate of this Embodiment is used, therefore, the effect of reducing crystal system separation can be more efficiently attained by adding Al to a single well layer so that the luminous efficiency of the light-emitting device can be improved. More specifically, the material for the seed substrate 201 can be selected from C-plane sapphire, M-plane sapphire, A-plane sapphire, R-plane sapphire, GaAs, ZnO, spinel, Ge, Si, GaN, 6H—SiC, 4H—SiC and 3C—SiC.

When the seed substrate 201 is formed by an SiC substrate or an Si substrate, the n electrode may be formed on the back surface of the substrate as shown in FIG. 1 since this substrate is conductive. In this case, however, a high-temperature buffer layer must be formed in place of the low-temperature buffer layer 202. The term "high-temperature buffer layer" denotes a buffer layer formed at a relatively high growth temperature of at least 700° C. The high-temperature buffer layer must contain Al. This is because no nitride semiconductor film having excellent crystallinity can be formed on the SiC substrate or the Si substrate unless the high-temperature buffer layer contains at least Al. The most preferable material for the high-temperature buffer layer is INAlN.

The growth inhibitor film 204 can be formed specifically by a dielectric film such as an $SiO_2$ film, an SiN, film, a $TiO_2$ film or an $Al_2O_3$ film or by a metal film such as a tungsten film.

Embodiment 3

Embodiment 3 is different from Embodiment 1 only in a point that a nitride semiconductor light-emitting diode is formed on a substrate other than a nitride semiconductor substrate through a nitride semiconductor buffer layer while a p electrode and an n electrode are formed on the same side of the substrate.

Figure 5:
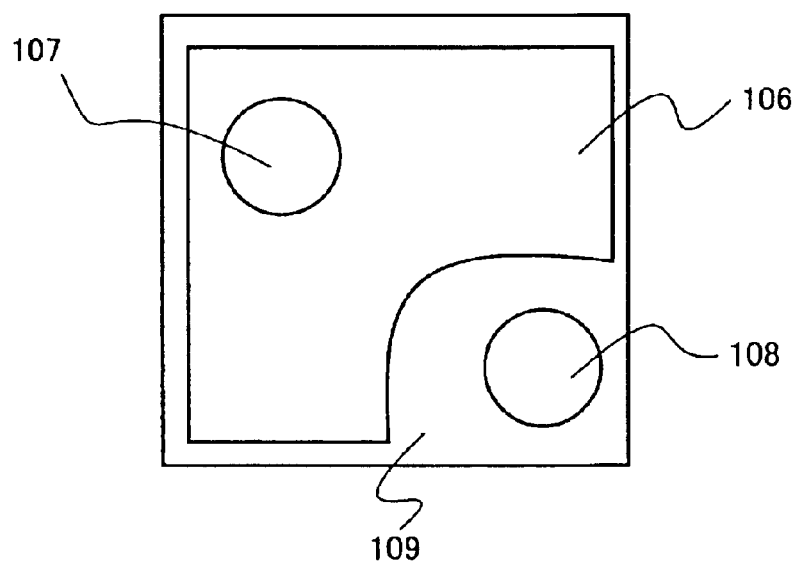
FIG. 5 is a top plan view of the light-emitting diode device shown in FIG. 4.

FIG. 4 shows the nitride semiconductor light-emitting diode according to Embodiment 3 as a schematic sectional view, and FIG. 5 shows a top plan view corresponding to FIG. 4. The diode device shown in FIG. 4 includes a C-plane {0001} sapphire substrate 300, a low-temperature GaN buffer layer 101 (thickness: 25 nm), an n-type GaN layer 102, a single well layer 103, a p-type $Al_{0.1}Ga_{0.9}N$ carrier blocking layer 104, a p-type GaN contact layer 105, an optically transparent electrode 106, a p electrode 107, an n electrode 108 and a dielectric film 109.

The nitride semiconductor light-emitting diode grown on the substrate (sapphire substrate) other than a nitride semiconductor substrate has higher crystal defect density (etch pit density of at least $4 \times 10^8/cm^2$) as compared with that grown on the nitride semiconductor substrate of Embodiment 1 or the pseudo GaN substrate of Embodiment 2. As compared with a conventional diode device including a GaNAs well layer, a GaNP well layer or a GaNSb well layer, however, crystal system separation is reduced and luminous intensity is improved in the device according to Embodiment 3 which includes the well layer containing Al.

While the sapphire substrate is employed in this Embodiment, 6H—SiC, 4H:SiC, 3C—SiC, Si or spinel (Mg $Al_2O_4$) may alternatively be employed as material for the substrate. The SiC substrate or the Si substrate is a conductive substrate, and hence the n electrode may be formed on the back surface of the substrate as shown in FIG. 1. When the SiC substrate or the Si substrate is employed, a high-temperature buffer layer containing Al must be formed similarly to the case of Embodiment 2.

While the C-plane {0001} substrate is employed in Embodiment 3, the plane orientation of the main surface of the substrate may alternatively be an A plane {11-20}, an R plane {1-102} or an M plane {1-100}. Further, on a main surface of the substrate having an off-angle within 2 degrees from the plane orientation, the surface morphology is improved.

Embodiment 4

In Embodiment 4, C (carbon) of $1 \times 10^{20}/cm^3$ is added in place of the Si impurity in the single well layer in every aforementioned Embodiment. Even when C is used in place of the impurity Si in the well layer, a similar effect is attained.

Embodiment 5

In Embodiment 5, Mg of $1 \times 10^{16}/cm^3$ is added in place of the Si impurity in the single well layer in every aforementioned Embodiment. Even when Mg is used in place of the impurity Si in the well layer, a similar effect is attained.

Embodiment 6

In Embodiment 6, a nitride semiconductor light-emitting diode including a single well layer according to the present invention is applied to a light-emitting device (a display or a white light source device). The light-emitting diode according to the present invention can be utilized for at least one of the three primary colors (red, green and blue) of light in the display.

For example, a conventional amber light-emitting diode including an InGaN well layer has a high In composition ratio (remarkable influence of phase separation), and does not reach a commercialization level in view of reliability and luminous intensity. However, the single well layer according to the present invention has no influence of phase separation due to In and can reduce crystal system separation, and hence it is possible to prepare a light-emitting diode for a color of a long wavelength. A light-emitting diode according to the present invention having another luminescent color can also be prepared with reference to the aforementioned Embodiments and Tables 1 and 2.

The aforementioned light-emitting diodes of the three primary colors according to the present invention can be utilized also in a white light source device. When coated with a fluorescent paint, the inventive light-emitting diode having an emission wavelength within a range of 380 nm to 440 nm can be utilized as a white light source device. When the inventive light-emitting diode is utilized for a white light source in place of a halogen light source in a conventional liquid crystal display, the white light source can be utilized as a backlight having low power consumption and high luminance. The white light source can also be utilized as a backlight for a liquid crystal display of a man-machine interface in a portable notebook-type computer or a portable telephone, and also enables provision of a miniature high-definition liquid crystal display.

Embodiment 7

A nitride semiconductor laser device according to Embodiment 7 of the present invention is now described.

Figure 7:
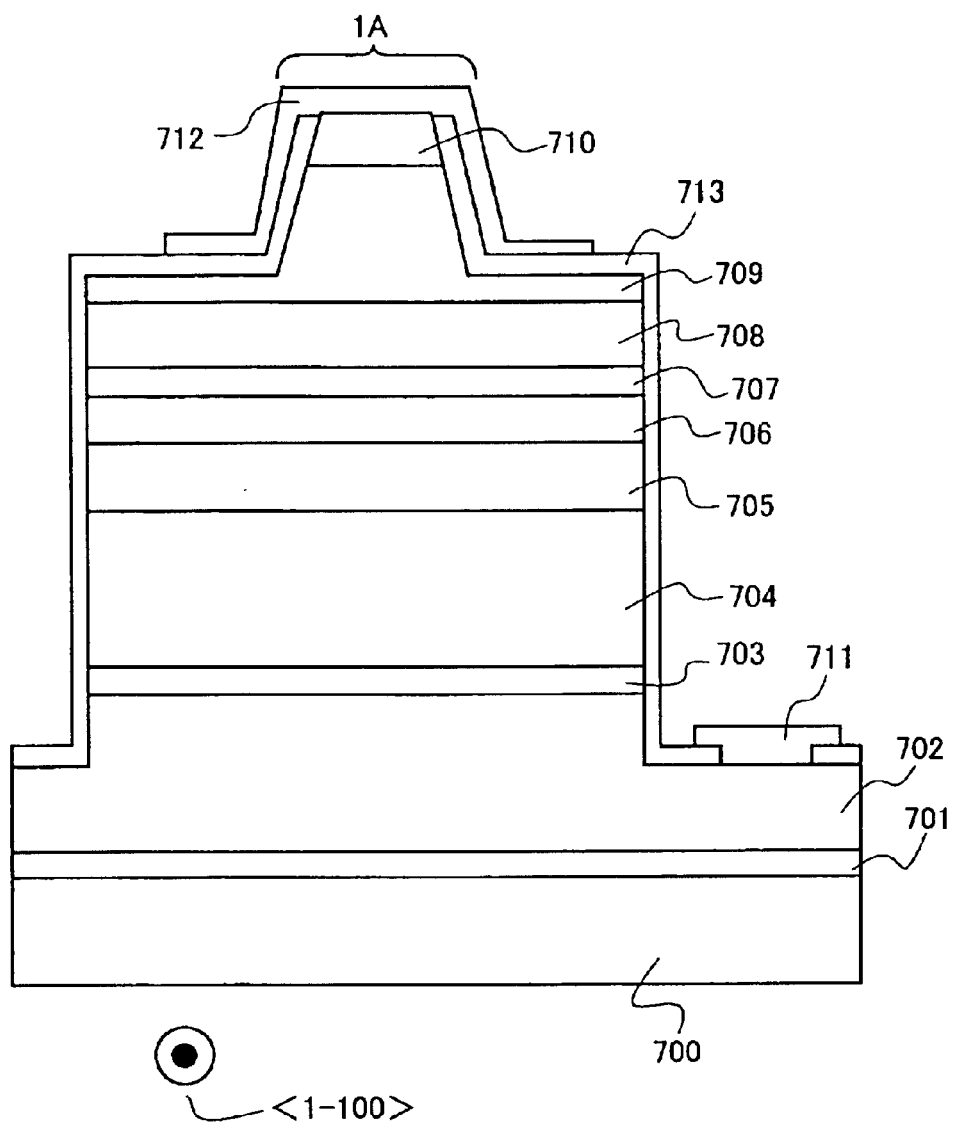
FIG. 7 is a schematic sectional view showing structure of a nitride semiconductor laser device according to still another Embodiment.

The nitride semiconductor laser device of Embodiment 7 shown in a schematic sectional view of FIG. 7 includes a C-plane (0001) sapphire substrate 700, a GaN buffer layer 701, an n-type GaN contact layer 702, an n-type $In_{0.07}Ga_{0.93}N$ anti-cracking layer 703, an n-type $Al_{0.1}Ga_{0.9}N$ cladding layer 704, an n-type GaN light guide layer 705, an emission layer 706, a p-type $Al_{0.2}Ga_{0.8}N$ shielding layer 707, a p-type GaN light guide layer 708, a p-type $Al_{0.1}Ga_{0.9}N$ cladding layer 709, a p-type GaN contact layer 710, an n-type electrode 711, a p-type electrode 712 and an $SiO_2$ dielectric film 713.

In formation of the laser device shown in FIG. 7, the sapphire substrate 700 is set in an MOCVD apparatus to grow the GaN buffer layer 701 to a thickness of 25 nm at a relatively low substrate temperature of 550° C. with $NH_3$ (ammonia) as a raw material for N of the group V element and TMGa (trimethyl gallium) as a raw material for Ga of the group III element. Then, $SiH_4$ (silane) is also utilized in addition to $NH_3$ and TMGa to grow the n-type GaN contact layer 702 (Si impurity concentration: $1\times10^{18}/cm^3$) to a thickness of 3 μm at a temperature of 1050° C. Then, the substrate temperature is reduced to about 700° C. to 800° C. to grow the n-type $In_{0.07}Ga_{0.93}N$ anti-cracking layer 703 to a thickness of 40 nm with TMIn (trimethyl indium) as a raw material for In of the group III element. The substrate temperature is increased to 1050° C. again to grow the n-type $Al_{0.1}Ga_{0.9}N$ cladding layer 704 (Si impurity concentration: $1\times10^{18}/cm^3$) of 0.8 μm thickness with TMAl (trimethyl aluminum) as a raw material for Al of the group III element, and then grow the n-type GaN light guide layer 705 (Si impurity concentration: $1\times10^{18}/cm^3$) to a thickness of 0.1 μm.

Thereafter the substrate temperature is reduced to 800° C. to form the emission layer 706 having a multiple quantum well structure by alternately stacking a plurality of GaN barrier layers each of 6 nm thickness and a plurality of $Al_{0.03}Ga_{0.97}N_{0.97}P_{0.03}$ well layers each of 4 nm thickness. According to this Embodiment, the emission layer 706 has a multiple quantum well structure starting with a barrier layer and ending with another barrier layer, and includes three quantum well layers. In growth of these barrier layers and well layers, $SiH_4$ is so added that both of these layers have Si impurity concentration of $1\times10^{18}/cm^3$. A growth interruption period of at least 1 second and not more than 180 seconds may be inserted between growth of each barrier layer and growth of each well layer or between growth of each well layer and growth of each barrier layer. In this case, the barrier layers and the well layers are so improved in flatness that the emission half-band width can be reduced.

In order to obtain a target emission wavelength in the case of employing an AlGaNAs-based or AlGaNP-based semiconductor for the well layers, any numerical value shown in the above Table 1 or 2 may be employed as a value for a content x or y of As or P in relation to the content a of Al. When an AlGaNSb-based semiconductor is used for the well layers, the Sb content in the group V elements is preferably not more than about 4%, as described before. This is because the crystal system of the AlGaNSb semiconductor is readily separated into a cubic system having a high Sb content and a hexagonal system having a low Sb content if the AlGaNSb semiconductor contains Sb in concentration higher than the upper limit.

After formation of the emission layer 706, the substrate is heated to 1050° C. again to successively grow the p-type $Al_{0.2}Ga_{0.8}N$ shielding layer 707 of 20 nm thickness, the p-type GaN light guide layer 708 of 0.1 μm thickness, the p-type $Al_{0.1}Ga_{0.9}N$ cladding layer 709 of 0.5 μm thickness and the p-type GaN contact layer 710 of 0.1 μm thickness. As to the p-type impurity, Mg can be added through $EtCP_3Mg$ (bisethylcyclopentadienyl magnesium) in concentration of $5\times10^{19}$ to $2\times10^{20}/cm^3$.

The p-type impurity concentration in the p-type GaN contact layer 710 is preferably increased as approaching the junction surface between the same and the p-type electrode 712. Thereby, contact resistance between the p-type GaN contact layer 710 and the p-type electrode can be further reduced. In order to remove residual hydrogen hindering activation of Mg as the p-type impurity in the p-type layers, a slight quantity of oxygen may be mixed during growth of the p-type layers.

After growth of the p-type GaN contact layer 710, all gas in the reaction chamber of the MOCVD apparatus is replaced with nitrogen carrier gas and $NH_3$, and the temperature is reduced at a cooling rate of 60° C./min. Supply of $NH_3$ is stopped when the substrate temperature is reduced to 800° C., and this substrate temperature of 800° C. is maintained for 5 minutes before subsequent cooling of the substrate to the room temperature. Such a temporary holding temperature for the substrate is preferably in a range of 650° C. to 900° C., and the holding time is preferably in a range of 3 minutes to 10 minutes. Further, the cooling rate from the holding temperature to the room temperature is preferably at least 30° C./min.

As a matter of fact, according to Raman measurement, the surface of the film grown in the aforementioned manner already exhibited a p-type property, even though the same was not subjected to the conventional annealing for activating the p-type impurity. Further, when the p-type electrode 712 was formed as described later, contact resistance thereof was also reduced.

A process of working the epitaxial wafer taken out from the MOCVD apparatus into the laser device is now described.

First, part of the n-type GaN contact layer 702 is exposed by a reactive ion etching apparatus, to form the n-type electrode 711 consisting of layers stacked in order of Hf/Au. Alternatively, stacked layers of Ti/Al, Ti/Mo, Hf/Al or the like can be employed as the material for the n-type electrode 711. Hf is effective for reducing the contact resistance of the n-type electrode. Regarding the p-type electrode part, etching is carried out in a striped manner along the <1-100> direction of the sapphire substrate 700, the $SiO_2$ dielectric film 713 is deposited, the p-type GaN contact layer 710 is exposed and the stacked layers of the order of Pd/Au is deposited thereby forming the ridge-striped p-type electrode 712 of 2 μm width. Stacked layers of Ni/Au or Pd/Mo/Au can alternatively be employed as the material for the p-type electrode.

Figure 8:
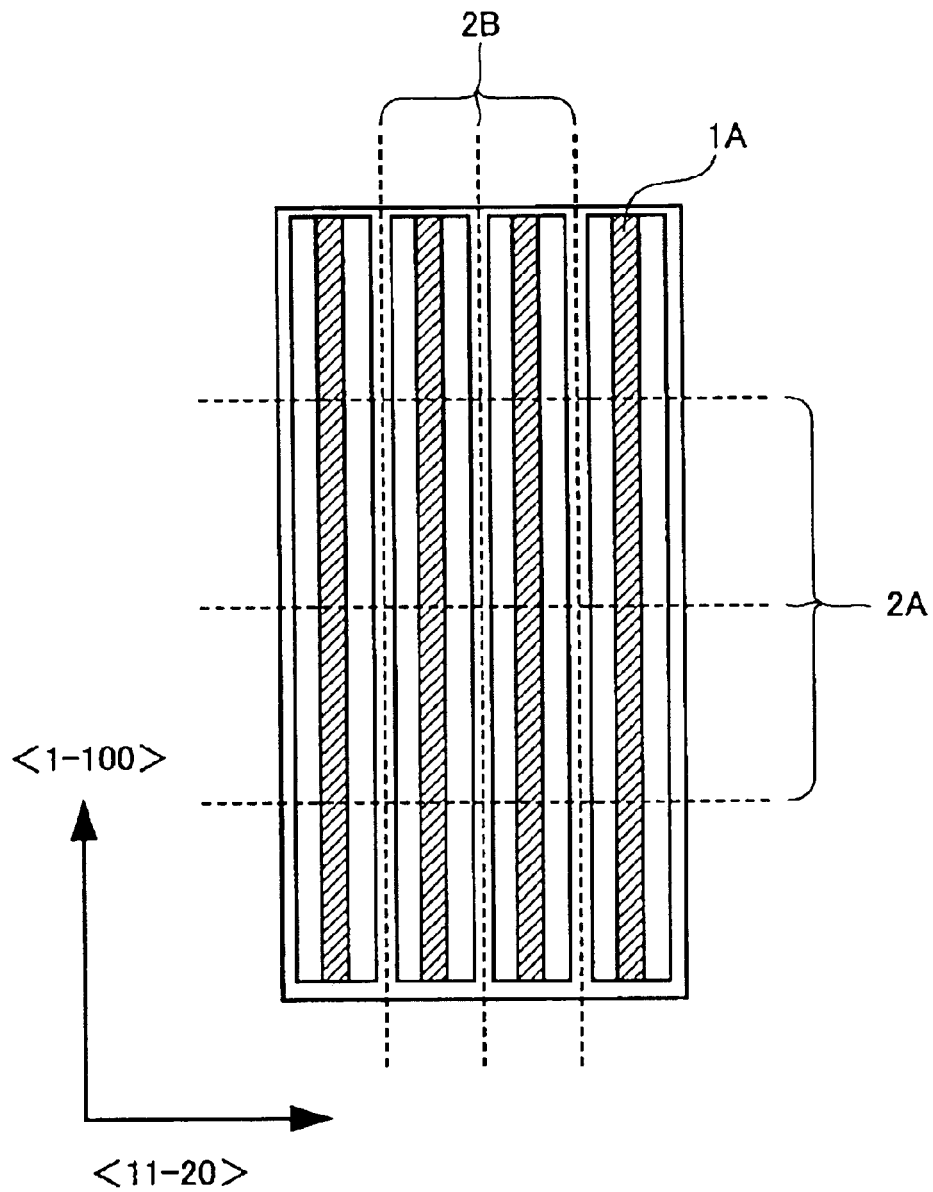
FIG. 8 is a schematic top plan view for illustrating chip division of a laser device according to Embodiment.

Finally, a Fabry-Perot resonator having a cavity length of 500 μm is prepared through cleavage or dry etching. This cavity length is preferably in a range of 300 μm to 1000 μm in general. The end mirror surfaces of the resonator are formed to coincide with the M plane of the sapphire substrate (see FIG. 8). Cleavage and chip division of the laser device are performed from the substrate side with a scriber along broken lines 2A and 2B shown in FIG. 8. Thus, flatness of the laser end surfaces can be obtained while no shavings resulting from scribing adhere to the surface of the epitaxial layer, whereby the yield of the light-emitting devices is improved.

The feedback method of the laser resonator is not restricted to the Fabry-Perot method but generally known DFB (distributed feedback) or DBR (distributed Bragg reflection) can alternatively be employed, as a matter of course.

After formation of the mirror end surfaces of the Fabry-Perot resonator, dielectric films of $SiO_2$ and $TiO_2$ are alternately deposited on one of the mirror end surfaces for forming a reflective dielectric multi-layered film having a reflectance of 70%. Alternatively, a multi-layered film of $SiO_2/Al_2O_3$ or the like can also be employed as the reflective dielectric multi-layered film.

The reason why the part of the n-type GaN contact layer 702 is exposed by reactive ion etching is that the insulating sapphire substrate 700 is used. In the case of using a conductive substrate such as a GaN substrate or an SiC substrate, therefore, no part of the n-type GaN layer 702 may be exposed but the n-type electrode may be formed on the back surface of the conductive substrate.

A method of mounting the aforementioned laser chip on a package is now described. When the laser including the aforementioned emission layer is employed in view of the characteristics thereof as a bluish-purple (wavelength: 410 nm) high-output (50 mW) laser suitable for an optical disk for high-density recording, attention must be given to heat dissipation since the sapphire substrate has low thermal conductivity. For example, it is preferable to connect the chip to a package body with an In solder material while the semiconductor junction is directed downward. The chip may not be directly mounted on the package body or a heat sink part but may be bonded thereto through a submount of Si, AlN, diamond, Mo, CuW, BN, Cu, Au or Fe having good thermal conductivity.

Figure 14:
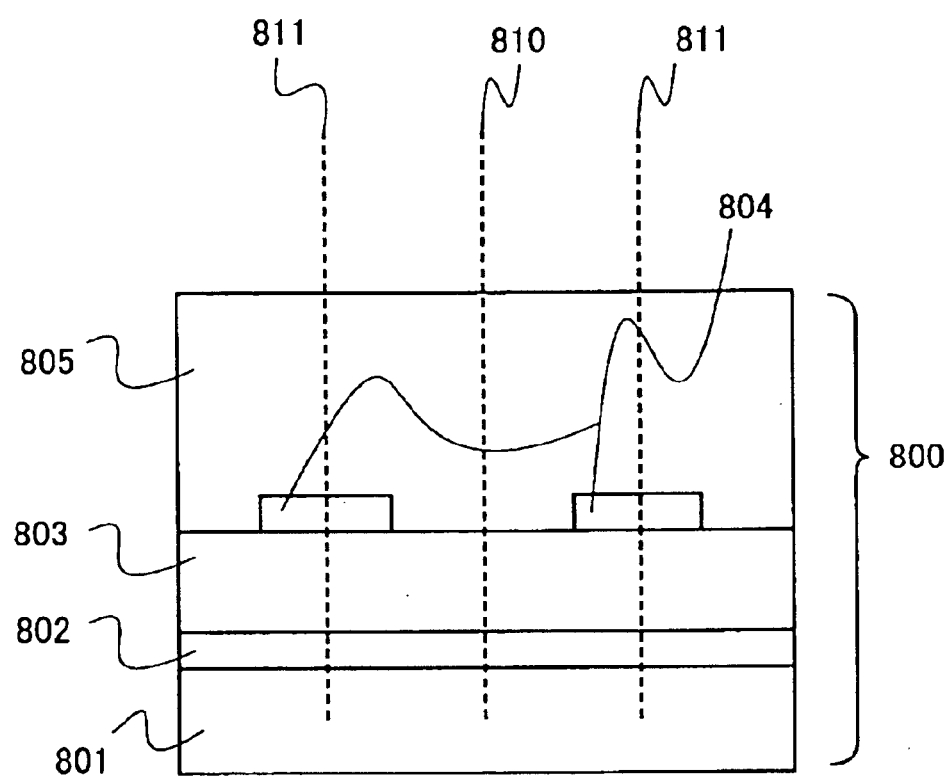
FIG. 14 is a schematic sectional view showing a nitride semiconductor thick-film substrate utilizable in a light-emitting device according to the present invention.

When the nitride semiconductor laser including the aforementioned emission layer is prepared on an SiC substrate, a nitride semiconductor substrate (e.g., a GaN substrate) or a GaN thick-film substrate (e.g., obtained by grinding the seed substrate 801 away from the substrate 800 of FIG. 14) having high thermal conductivity, the chip can also be connected to the package body with the In solder material while the semiconductor junction is directed upward, for example. Also in this case, the substrate of the chip may not be directly mounted on the package body or the heat sink part but may be connected through a submount of Si, AlN, diamond, Mo, CuW, BN, Cu, Au or Fe.

As described above, it is possible to prepare the laser utilizing the nitride semiconductor containing Al for the well layers included in the emission layer.

More detailed description is now made in relation to the emission layer 706 included in the laser according to the aforementioned Embodiment.

In the case of preparing a light-emitting device utilizing a conventional InGaN quantum well layer, the chemical thermal equilibrium state of the InGaN layer is so unstable that it is difficult to form an emission layer having excellent crystallinity, as described before. Particularly in the case of growing an InGaN crystal layer having an In content of at least 15% in the group III elements, the InGaN crystal is readily concentration-separated into regions having high and low In contents depending on the growth temperature. Such concentration separation causes reduction of luminous efficiency and increase of the half width of the emission wavelength (color heterogeneity). On the other hand, the GaNAs well layer disclosed in Japanese Patent Laying-Open 10-270804 contains no In and thus causes no problem of the aforementioned concentration separation, but it contains As which is liable to cause crystal system separation into a hexagonal system and a cubic system and then reduce the crystallinity and the luminous efficiency.

The AlGaNAsPSb well layer according to the present invention, containing Al in place of In while containing at least any element of As, P and Sb, can realize a target emission wavelength by adjusting the contents (see Tables 1 and 2). Therefore, the well layer according to the present invention is exraneous to the aforementioned concentration separation related to In. For example, a conventional amber light-emitting diode has a high In content (i.e., remarkable influence of phase separation) in its InGaN well layer, and thus does not reach a commercialization level in view of its reliability and luminous intensity. However, the AlGaNAsPSb well layer according to the present invention containing no In causes no problem of concentration separation in relation to In, but can enable preparation of a light-emitting device capable of emitting long wavelength light shown in Table 1 or 2.

The AlGaNAsPSb well layer according to the present invention contains Al, differently from the conventional GaNAs well layer (As is at least partially replaceable with P and/or Sb: this also applies to the following description). In other words, the crystal system separation being problematic in the conventional GaNAs well layer can be suppressed by introducing Al as in the present invention. This crystal system separation conceivably results from the fact that adhesion of As (this also applies to P or Sb) with respect to the group III elements is very high as compared with N and that N has extremely high volatility (i.e., N readily escapes from the crystal) as compared with As (this also applies to P or Sb). Therefore, it is conceivably possible to suppress crystal system separation by adding Al of the group III element having very high reactivity thereby capturing N and preventing N from escaping from the grown crystal. Further, the well layer according to the present invention, containing at least any element of As, P and Sb, can reduce the effective mass of electrons and holes and improve carrier mobility.

Thus, when the well layer according to the present invention is utilized for a light-emitting device, it is possible to implement a long-lived light-emitting device having low power consumption and high output due to the high crystallinity in the well layer and the reduction of the effective mass of carriers.

The Al content in the inventive well layer is now described. First, the inventors have investigated what degree of As, P or Sb content causes the aforementioned crystal system separation. As a result, the crystal system separation started to take place when As, P or Sb was added into a GaN crystal in concentration of $1 \times 10^{18}/cm^3$ (crystal system separation ratio of about 2 to 3%), and the crystal system separation ratio reached about 13 to 15% when the content was about 10% of the group V elements in the well layer. The term "crystal system separation ratio" denotes the volume ratio of crystal system separation regions to normal regions having an average composition ratio without crystal system separation, in the unit volume of the well layer.

In relation to the well layer according to the present invention, influence exerted by the Al content on the crystal system separation ratio and the luminous intensity has already been considered with reference to FIG. 6.

The emission layer according to the present invention preferably has a multiple quantum well structure obtained by alternately stacking a plurality of quantum well layers and a plurality of barrier layers. This is because threshold current density is reduced in a laser (see FIG. 9) and luminous intensity is improved in a light-emitting diode (see FIG. 16) by employing the multiple quantum well structure. Such advantages resulting from employment of the multiple quantum well structure can be remarkably and reliably attained due to the addition of Al according to the present invention. This is because crystal system separation of the well layers is suppressed and interfacial steepness between the well layers and the barrier layers is improved when Al is added to the well layers containing at least one of As, P and Sb. In a conventional GaNAs well layer containing no Al, for example, regions having different crystal systems are mixed therein and hence interfacial steepness between the well layer and a barrier layer is remarkably deteriorated as the number of stacked layers is increased. Such deterioration of the interfacial steepness makes it difficult to form the multiple quantum well structure, and causes color heterogeneity and reduction of luminous intensity in the light-emitting device. The present invention enables formation of the multiple quantum well structure without reducing interfacial steepness by adding Al into the well layers.

The relation between the well layer and the barrier layer constituting the emission layer is now described. An $Al_a Ga_{1-a} N_{1-x-y-z} As_x P_y Sb_x$ (023 $x \leq 0.10$, $0 \leq y \leq 0.16$, $0 \leq z \leq 0.04$, x+y+z>0) well layer according to the present invention, causing neither concentration separation nor crystal system separation described above, can be grown to a thickness of about 300 nm depending on the Al content if the contents of As, P and Sb are within the respective limited ranges. For a light-emitting device utilizing the multiple quantum well effect, however, a thickness of the well layer is preferably in a range of 0.4 to 20 nm. The reason why the lower limit is 0.4 nm is that no light emission is attained unless the thickness of the well layer is in excess of this level.

The most preferable barrier layer for the $Al_a Ga_{1-a} N_{1-x-y-z} As_x P_y Sb_z$ well layer is a nitride semiconductor barrier layer containing none of As, P and Sb. If the barrier layer itself contains none of As, P and Sb, it causes no crystal system separation. This means that the barrier layer causes no hindrance in formation of the multiple quantum well structure.

A barrier layer of InGaN, GaN, InAlGaN or AlGaN can be employed as the nitride semiconductor barrier layer containing none of As, P and Sb. The growth temperature for an InGaN barrier layer containing In can be reduced to about that for the well layer, and the crystallinity thereof is improved. In order to suppress concentration separation related to In, however, the In content must be set to less than 15% of the group III elements. A GaN barrier layer containing no In causes no concentration separation. However, the crystallinity is deteriorated if the growth temperature therefor is low, and hence it is important to set the growth temperature as high as possible. An InAlGaN barrier layer containing Al can stably grow also at a high growth temperature. This barrier layer contains In and hence the growth temperature therefor can be reduced to about that for the well layer. Also in this case, however, the In content must be set to less than 15% of the group III elements. An AlGaN barrier layer is deteriorated in crystallinity unless the same is grown at a high temperature, and hence it is desirable to reduce the Al content to the minimum (not more than 10% of the group II elements) within its allowable range and to increase the growth temperature therefor to the maximum within its allowable range.

A nitride semiconductor barrier layer containing at least any of As, P and Sb is now described. In spite of the above description, an advantage of taking a risk of introducing As, P and/or Sb into the barrier layer resides in that the refractive index of the barrier layer containing As, P and/or Sb tends to increase and hence light confinement efficiency is so improved as to reduce lasing threshold current density or improve optical properties. A barrier layer of InAlGaNAs, InAlGaNP, InAlGaNSb, InAlGaNAsP, InAlGaNAsPSb, AlGaNAs, AlGaNP, AlGaNSb, AlGaNAsP, AlGaNAsPSb, GaNAs, GaNP, GaNSb, GaNAsP, GaNAsPSb, InGaNAs, InGaNP, InGaNSb, InGaNAsP or InGaNAsPSb, for example, can be employed as the nitride semiconductor barrier layer containing at least any of As, P and Sb.

Among these barrier layers, that containing Al can suppress influence of crystal system separation similarly to the inventive well layer. In each barrier layer containing In, however, it is necessary to set the In content to less than 15% of the group III elements in order to suppress concentration separation of In. In each barrier layer containing no Al, the content of As, P and/or Sb in the group V elements must be suppressed low in order to suppress crystal system separation. According to investigation by the inventors, however, since the barrier layer does not directly emit light due to recombination of injected carriers differently from the well layer, it exhibited larger tolerance with respect to the crystal system separation ratio as compared with the well layer. The tolerance of As is not more than about 5%, that of P is not more than about 6% and that of Sb is not more than about 3% in the group V elements. Each barrier layer containing In can preferably reduce its energy band gap thereby suppressing the contents of As, P and Sb (i.e., the crystal separation ratio can be reduced). Also in this case, however, the In content must be set to less than 15% of the group III elements in order to suppress In concentration separation.

A thickness of the barrier layer is preferably in a range of 1 to 20 nm. The number of the barrier layers in the multiple quantum well structure is naturally adjusted in relation to the number of the well layers, since the well layers and the barrier layers are alternately stacked.

In relation to addition of the impurity to the emission layer, while $SiH_4$ (Si) is added to both of the well layers and the barrier layers as the impurity in this Embodiment, the impurity may alternatively be added to only either layers, or lasing is possible also when no impurity is added to the layers. As a result of photoluminescence (PL) measurement, however, PL luminous intensity was strengthened in a range of about 1.2 times to about 1.4 times in the case of adding $SiH_4$ to both of the well layers and the barrier layers as compared with the case of adding no impurity. Thus, it is preferable to add an impurity such as $SiH_4$ (Si) into the emission layer in the light-emitting diode. Since the inventive well layer is formed of an AlGaNAsPSb mixed crystal system containing absolutely no In, it forms no localized energy levels due to In differently from the conventional InGaN mixed crystal and then the luminous intensity conceivably depends strongly on the crystallinity of the well layer. Therefore, it is desired to improve the crystallinity of the emission layer by adding an impurity such as Si. In other words, such an impurity forms nuclei for crystal growth and the well layer is crystal-grown from the nuclei thereby improving the crystallinity. Although Si ($SiH_4$) is added in concentration of $1 \times 10^{18}/cm^3$ according to this Embodiment, a similar effect is attained also when adding O, S, C, Ge, Zn, Cd or Mg in place of Si. The concentration of the added atoms is preferably in a range of about $1 \times 10^{16}$ to $1 \times 10^{20}/cm^3$.

Generally in the case of a laser, when modulation doping is carried out by adding an impurity only to barrier layers, the threshold current density is reduced due to less carrier absorption in well layers. Nevertheless, when the impurity is added into the inventive well layers, the threshold of the laser is rather reduced. This is conceivably because this Embodiment progresses crystal growth starting from the sapphire substrate different from the nitride semiconductor substrate and hence the number of crystal defects is so large (threading dislocation density: about $1 \times 10^{10}/cm^2$) that it is more effective for reducing the laser threshold current density to improve the crystallinity by adding the impurity than considering carrier absorption due to the impurity in the well layers.

Figure 9:
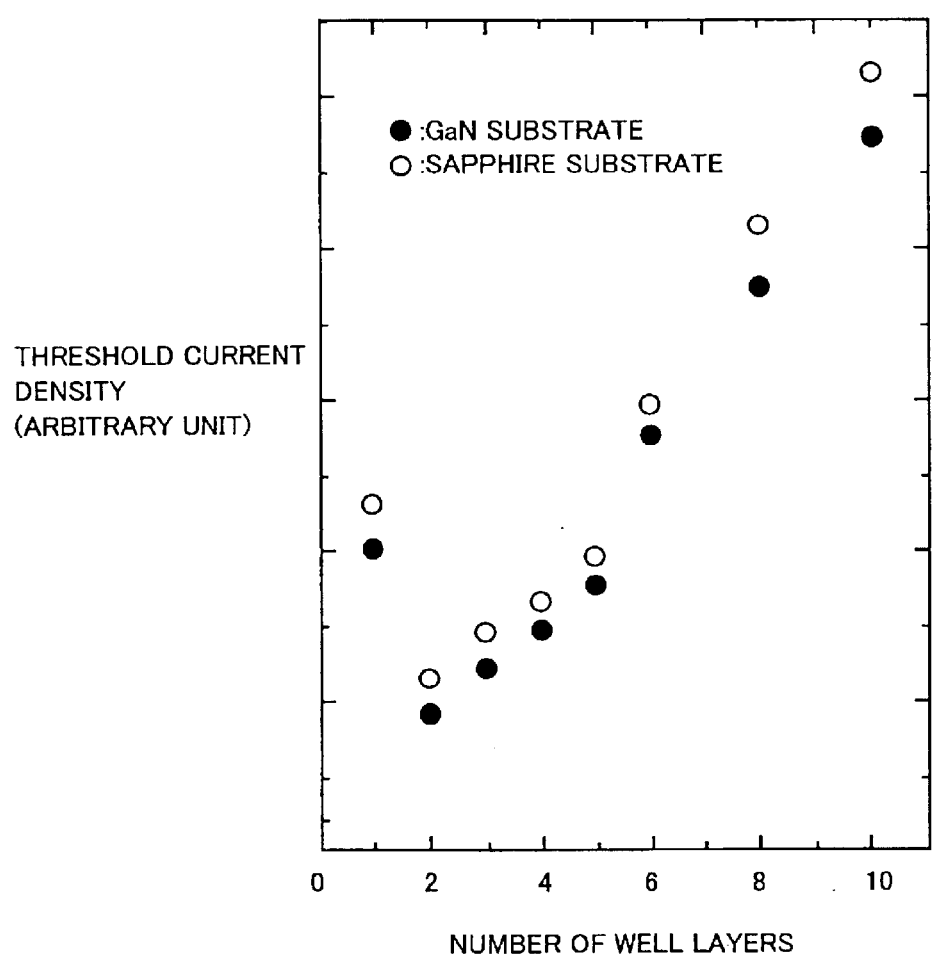
FIG. 9 is a graph showing relation between the number of well layers of laser devices and threshold current densities of the devices.

FIG. 9 shows relation between the number of the well layers included in the emission layer (multiple quantum well structure) and the laser threshold current density. The horizontal axis of this graph shows the numbers of the well layers, and the vertical axis shows the threshold current density (arbitrary unit). Marks ○ show laser threshold current density values in the case of employing a sapphire substrate, and marks ● show those in the case of employing a GaN substrate. When the number of the well layers is not more than 10, continuous lasing at the room temperature is enabled. In order to further reduce the lasing threshold current density, the number of the well layers is preferably at least 2 and not more than 5. Further, it is understood that the threshold current density is reduced by using not the sapphire substrate but the GaN substrate.

The p-type AlGaN shielding layer 707 and the p-type layer 708 are stacked in this order on the emission layer 706. This p-type layer 708 corresponds to a p-type light guide layer in the case of a laser, and corresponds to a p-type cladding layer or a p-type contact layer in the case of a light-emitting diode.

As a result of PL measurement, the shift quantity from a designed emission wavelength was smaller and PL luminous intensity was stronger in the case having the shielding layer 707 as compared with in the case of having no shielding layer. As compared with the emission layer 706, the growth temperature for the p-type layer 708 provided thereon is so high that escape of N takes place particularly in barrier layers containing no Al and then it consequently acts to promote the crystal system separation. By providing the shielding layer 707 containing Al at the interface between the emission layer and the p-type layer provided thereon, however, it is possible to suppress N escape and crystal system separation and then to prevent propagation of influence (such as crystal system separation) from the emission layer 706 to the p-type layer 708. Particularly when the emission layer 706 having the multiple quantum well structure has an energy band structure of FIG. 10A starting with a barrier layer and ending with another barrier layer, the effect of the shielding layer 707 is remarkably recognized.

As seen from the above, it is important that the shielding layer 707 contains at least Al. Further, the polarity of the shielding layer is preferably the p type. This is because the position of the p-n junction in the vicinity of the emission layer is changed thereby to reduce the luminous efficiency unless the shielding layer is of the p type.

Similarly to the above case, an n-type AlGaN shielding layer may be provided to be in contact between the emission layer 706 and the n-type layer 705. This n-type layer 705 corresponds to an n-type light guide layer in the case of a laser, and corresponds to an n-type cladding layer or an n-type contact layer in the case of a light-emitting diode. The effect of such an n-type AlGaN shielding layer is substantially similar to that of the p-type AlGaN shielding layer 707.

Figure 10A:
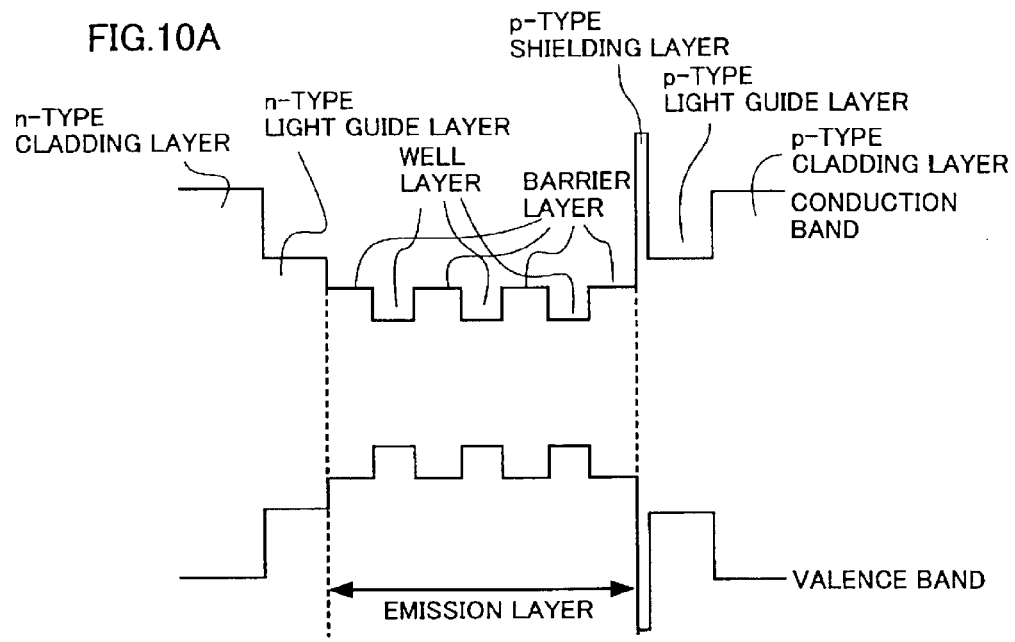
FIGS. 10A and 10B schematically illustrate energy band gap structures in light-emitting devices according to Embodiments.
Figure 12:
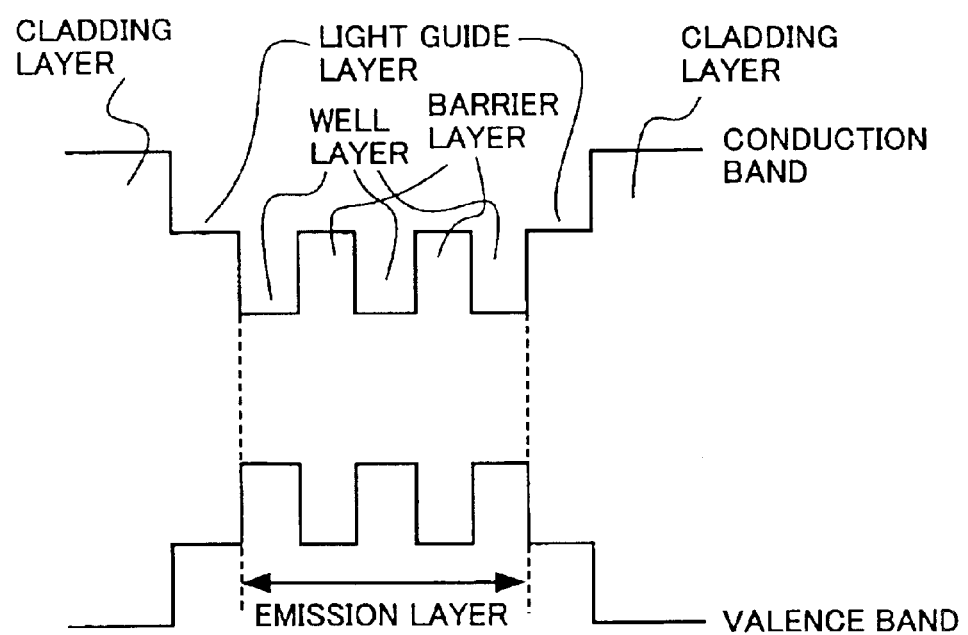
FIG. 12 schematically illustrates a further exemplary energy band gap structure in a light-emitting device according to Embodiment.

As the band gap structure of the emission layer, it is possible to employ the structure exemplarily illustrated in FIG. 12 or FIG. 10A. FIG. 12 illustrates a case where light guide layers and barrier layers are made of the same nitride semiconductor material. As illustrated in FIG. 10A, however, the band gaps of the light guide layers and the barrier layers may be different from each other.

More specifically, the energy band gap of the barrier layers is rendered smaller as compared with that of the light guide layer, as shown in FIG. 10A. Then, a multiple quantum well effect resulting from sub-bands is readily attained as compared with the case shown in FIG. 12, while the refractive index of the barrier layers exceeds that of the light guide layer to improve the light confinement effect, so that the characteristic (unimodality) of the vertical transverse mode can be improved. Particularly when the barrier layers contain As, P or Sb, the refractive index thereof preferably tends to increase remarkably.

Figure 10B:
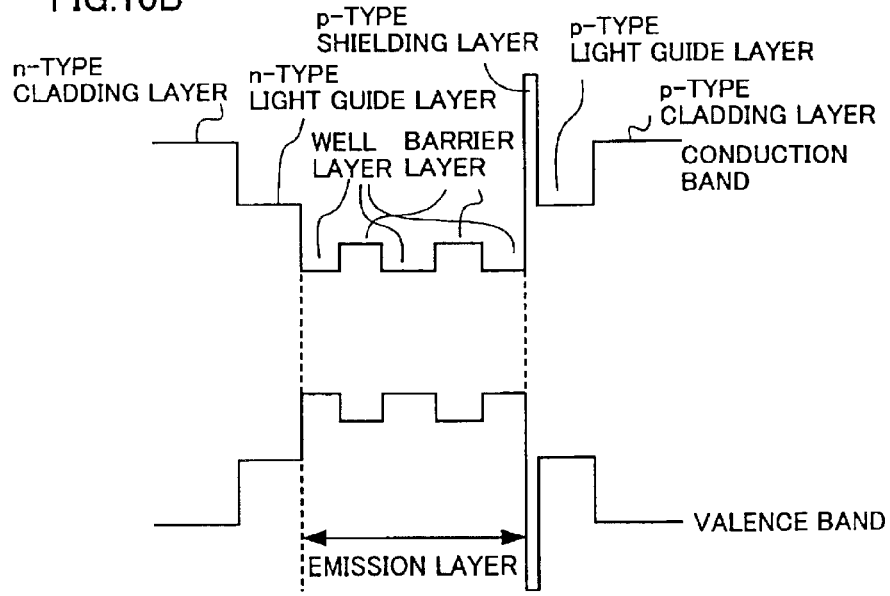
Figure 11A:
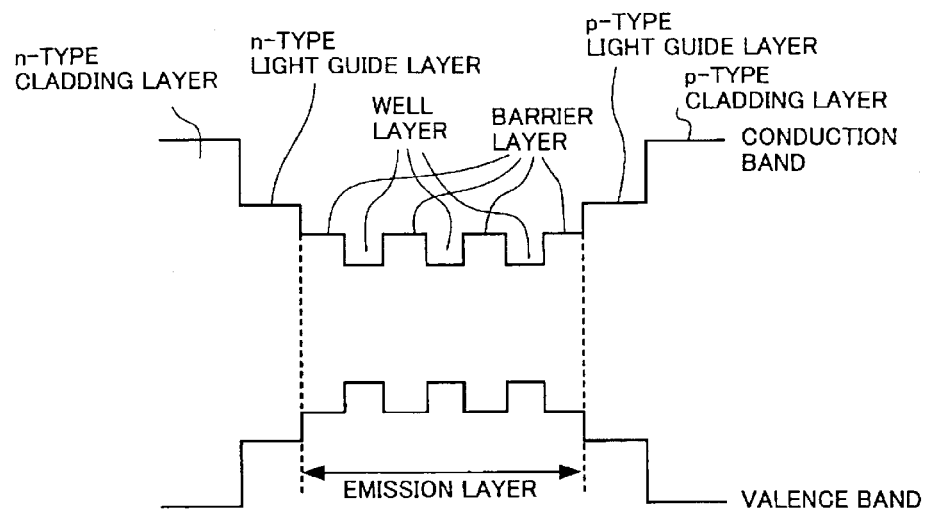
FIGS. 11A and 11B schematically illustrate other exemplary energy band gap structures in light-emitting devices according to Embodiments.
Figure 11B:
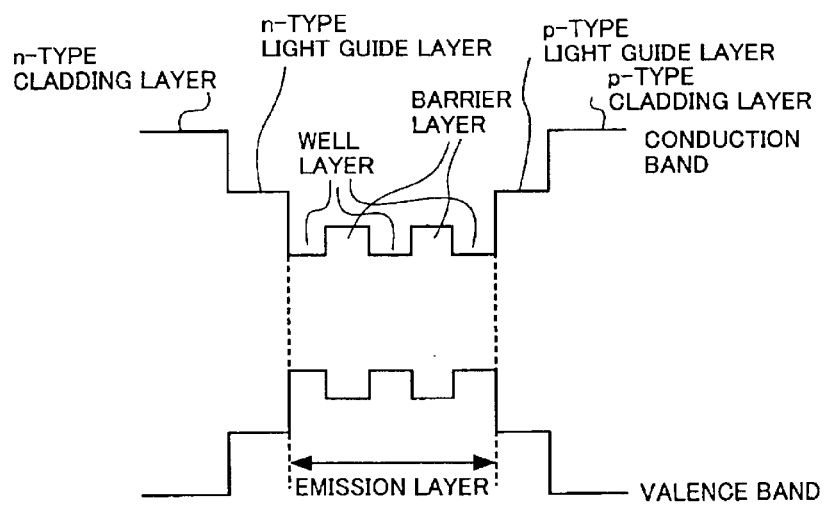

Two types of structures are possible for the aforementioned emission layer rendering the energy band gap of the barrier layers smaller as compared with the light guide layer, as shown in FIGS. 10A and 10B. In other words, the emission layer having the multiple quantum well structure may have either the structure starting with a barrier layer and ending with another barrier layer or the structure starting with a well layer and ending with another well layer. FIGS. 11A and 11B show band gap structures of the emission layer with no shielding layer.

Embodiment 8

In Embodiment 8, nitride semiconductor materials for well layers and barrier layers are varied in the emission layer having the multiple quantum well structure described with reference to Embodiment 7. Table 3 shows the combinations of the nitride semiconductor materials for the well layers and the barrier layers.

TABLE 3

| | | Well Layer | | |
|---|---|---|---|---|
| | | AlGaNAs | AlGaNP | AlGaNSb |
| Barrier Layer | GaN | ○ | ○ | ○ |
| | GaNAs | ○ | ○ | ○ |
| | GaNP | ○ | ○ | ○ |
| | GaNSb | ○ | ○ | ○ |
| | InGaN | ○ | ○ | ○ |
| | InGaNAs | ○ | ○ | ○ |
| | InGaNP | ○ | ○ | ○ |
| | InGaNSb | ○ | ○ | ○ |
| | AlGaN | ○ | ○ | ○ |
| | AlGaNAs | ○ | ○ | ○ |
| | AlGaNP | ○ | ○ | ○ |
| | AlGaNSb | ○ | ○ | ○ |
| | InAlGaN | ○ | ○ | ○ |
| | InAlGaNAs | ○ | ○ | ○ |
| | InAlGaNP | ○ | ○ | ○ |
| | InAlGaNSb | ○ | ○ | ○ |

Referring to Table 3, marks ○ show preferable combinations of nitride semiconductor materials for the well layers and the barrier layers. The well layer contains any element As, P or Sb in Table 3, but it may alternatively contain a plurality of such elements. In other words, the well layer may be made of mixed crystals of $AlGaN_{1-x-y-z}As_xP_ySb_z$ ($0 \leq x \leq 0.10$, $0 \leq y \leq 0.16$, $0 \leq z \leq 0.04$, $x+y+z>0$). The other remaining conditions related to the emission layer utilizing these nitride semiconductor materials are similar to those in the case of Embodiment 7.

Embodiment 9

Figure 13:
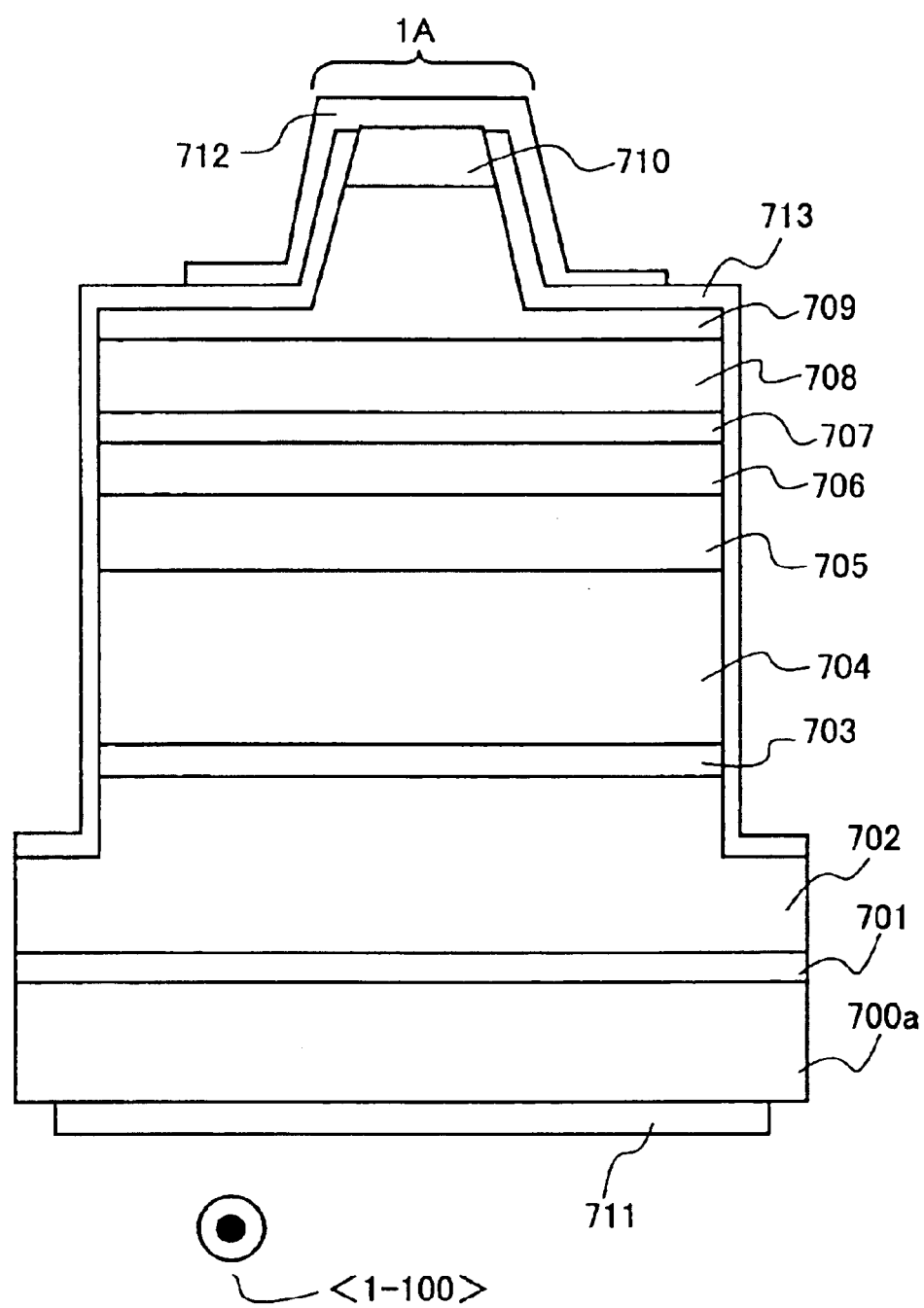
FIG. 13 is a schematic sectional view showing structure of a laser device employing a nitride semiconductor substrate according to Embodiment.

In Embodiment 9 shown in FIG. 13, an n-type GaN substrate 700a having the C plane (0001) as its main surface is employed in place of the sapphire substrate 700 used in Embodiment 7. In the case of using the GaN substrate 700a, an n-type GaN layer 702 may be directly grown on the GaN substrate with a GaN buffer layer 701 being omitted. However, crystallinity and surface morphology of a GaN substrate commercially available at present are not sufficiently satisfactory and hence it is rather preferable to insert the GaN buffer layer 701 in order to improve these.

In this Embodiment 9 using the n-type GaN substrate 700a, an n-type electrode 711 can be formed on the back surface of the GaN substrate 700a. Further, cleaved end surfaces of the GaN substrate are so smooth that a Fabry-Perot resonator having a cavity length of 300 μm can be prepared with low mirror loss. Similarly to the case of Embodiment 7, the cavity length is preferably in a range of 300 μm to 1000 μm in general. The mirror end surfaces of the resonator are formed corresponding to a {1-100} plane of the GaN substrate 700a. Cleavage and chip division into the laser device are performed from the substrate side with a scriber similarly to the aforementioned case of FIG. 8. It is also possible to employ the aforementioned DFB or TBR as the feedback-method for the laser resonator as a matter of course, and it is needless to say that a reflective dielectric multi-layered film may be formed on one of the mirror end surfaces similarly to the case of Embodiment 7.

When the GaN substrate is employed in place of the sapphire substrate, thicknesses of an n-type AlGaN cladding layer 704 and a p-type AlGaN cladding layer 709 can be increased without causing cracks in the epitaxial wafer. Thicknesses of these AlGaN cladding layers are preferably set in a range of 0.7 to 1.5 μm. Thereby, the vertical transverse mode is rendered unimodal and the light confinement effect is improved and then it become possible to improve optical characteristics of the laser device and reduce the laser threshold current density.

The characteristics of the well layers included in the emission layer according to the present invention strongly depend on the crystallinity (crystal defects) of the well layers as described before. When the nitride semiconductor laser device including the well layers is prepared with the GaN substrate as in this Embodiment, therefore, crystal defect density (e.g., threading dislocation density) in the emission layer is reduced and the lasing threshold current density is reduced in a range of 10% to 20% as compared with Embodiment 7 using the sapphire substrate.

The other remaining conditions related to the emission layer in this Embodiment are similar to those in the case of Embodiment 7. In relation to impurity concentration in the emission layer, however, laser threshold current density is reduced as compared with Embodiment 7 by employing modulation doping of adding an impurity only into barrier layers or by adding an impurity in concentration of $3 \times 10^{18}$/cm$^3$ into the well layers. This is conceivably because the crystallinity of the emission layer is improved as compared with the case of employing the sapphire substrate, as described above.

Embodiment 10

Embodiment 10 is similar to Embodiment 7 or Embodiment 9 except that the sapphire substrate 700 of Embodiment 7 was replaced with a substrate 800 shown in FIG. 14. The substrate 800 of FIG. 14 includes a seed substrate 801, a buffer layer 802, an n-type GaN film 803, a dielectric film 804 and an n-type GaN thick film 805 successively stacked in this order.

In preparation of such a substrate 800, the buffer layer 802 is first stacked on the seed substrate 801 by MOCVD at a relatively low temperature of 550° C. The n-type GaN film 803 of 1 μm thickness is formed thereon being doped with Si at a temperature of 1050° C.

The wafer formed with the n-type GaN film 803 is taken out from the MOCVD apparatus to form the dielectric film 804 in a thickness of 100 nm by sputtering, CVD or EB deposition, and the dielectric film 804 is worked into a periodic striped pattern. These stripes formed along a <1-100> direction of the n-type GaN film 803 have a periodic pitch of 100 μm and a stripe width of 5 μm in a <11-20> direction perpendicular to the <1-100> direction.

Then, the wafer with the dielectric film 804 worked in a striped manner is set in an HVPE apparatus so that the n-type GaN thick film 805 having Si concentration of $1 \times 10^{18}$/cm$^3$ and a thickness of 350 μm is deposited at a growth temperature of 1100° C.

The wafer formed with the n-type GaN thick film 805 is taken out from the HVPE apparatus so that a laser similar to that of Embodiment 7 (see FIG. 7) is prepared thereon. In this Embodiment 10, however, the laser is so prepared that a ridge strip part IA thereof is not located immediately above lines 810 and 811 in FIG. 14. This is in order to prepare the laser device on a part having small threading dislocation density (i.e., crystal defect density). The characteristics of the laser of Embodiment 10 prepared in this manner are basically similar to those in the case of Embodiment 9.

The substrate 800 may be employed as a substrate for a laser after removing the seed substrate 801 by a grinder. Further, the substrate 800 may be employed as a substrate for a laser after removing the buffer layer 802 and the layer thereunder by a grinder. In addition, the substrate 800 may be employed as a substrate for a laser after removing the dielectric film 804 and all the layers thereunder by a grinder.

When the seed substrate 801 is removed, an n-type electrode 711 can be formed on the back surface of the substrate similarly to the case of Embodiment 9. It is also possible to remove the seed substrate 801 after preparing the laser.

In preparation of the aforementioned substrate 800, the seed substrate 801 may be made of any material such as C-plane sapphire, M-plane sapphire, A-plane sapphire, R-plane sapphire, GaAs, ZnO, MgO, spinel, Ge, Si, 6H—SiC, 4H—SiC or 3C—SiC. Any of a GaN layer, an AlN layer, an $Al_xGa_{1-x}N$ (0<x<1) layer or an $In_yGa_{1-y}N$ (0<y≦1) layer grown at a relatively low temperature of 450° C. to 600° C. may be employed as the buffer layer 802. An n-type $Al_zGa_{1-z}N$ (0<z<1) film is employable in place of the n-type GaN film 803. Any of an $SiO_2$ film, an $SiN_x$ film, a $TiO_2$ film and an $Al_2O_3$ film may be employed as the dielectric film 804. The n-type GaN thick film 805 may be replaced with an n-type $Al_wGa_{1-w}N$ (0<w≦1) thick film, and a thickness thereof may be at least 20 μm.

Embodiment 11

Figure 15A:
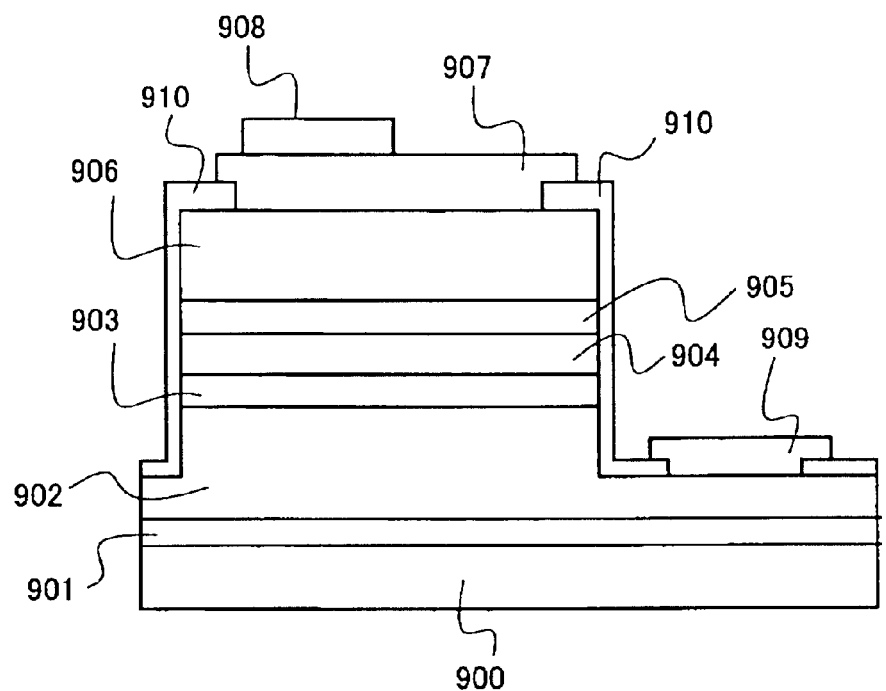
FIG. 15A is a schematic sectional view showing an exemplary light-emitting diode device according to the present invention.

Embodiment 11 relates to a nitride semiconductor light-emitting diode device. FIG. 15A is a schematic vertical sectional view of a nitride semiconductor light-emitting diode device of Embodiment 11, and FIG. 15 is a top plan view corresponding to FIG. 15A.

The light-emitting diode device of FIG. 15A includes a C-plane (0001) sapphire substrate 900, a GaN buffer layer 901 (thickness: 30 nm), an n-type GaN contact layer 902 (thickness: 3 μm, Si impurity concentration: $1 \times 10^{18}/cm^3$), an n-type $Al_{0.1}Ga_{0.9}N$ shielding and cladding layer 903 (thickness: 20 nm, Si impurity concentration: $1 \times 10^{18}/cm^3$), an emission layer 904, a p-type $Al_{0.2}Ga_{0.8}N$ shielding and cladding layer 905 (thickness: 20 nm, Si impurity concentration: $6 \times 10^{19}/cm^3$), a p-type GaN contact layer 906 (thickness: 200 nm, Mg impurity concentration: $1 \times 10^{20}/cm^3$), an optically transparent p-type electrode 907, a pad electrode 908, an n-type electrode 909 and a dielectric film 910.

In such a light-emitting diode device, however, the n-type $Al_{0.1}Ga_{0.9}N$ shielding and cladding layer 903 may alternatively be omitted. The p-type electrode 907 is made of Ni or Pd, the pad electrode 908 is made of Au, and the n-type electrode 909 can be formed by a laminate of Hf/Au, Ti/Al, Ti/Mo or Hf/Al.

Figure 15B:
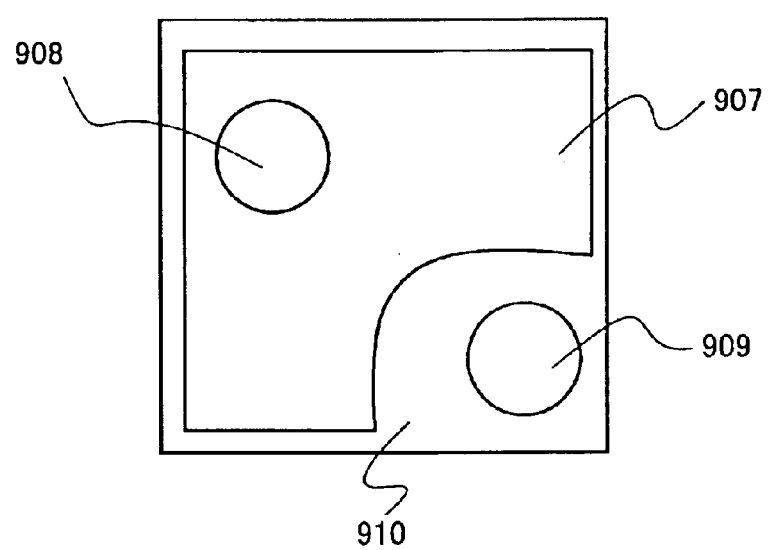
FIG. 15B is a schematic top plan view corresponding to the diode device shown in FIG. 15A.

In the emission layer of this Embodiment, $SiH_4$ (Si impurity concentration: $5 \times 10^{17}/cm^3$) is added to all the well layers and barrier layers. Nitride semiconductor materials for these well layers and barrier layers are similar to those in the case of Embodiment 7. An effect similar to that of Embodiment 9 is attained when a GaN substrate is employed in place of the sapphire substrate 900, and an effect similar to that of Embodiment 10 is also attained when the substrate shown in FIG. 14 is employed. Further, since the GaN substrate is a conductive substrate, both of the p-type electrode 907 and the n-type electrode 909 may be formed on one side of the light-emitting device as shown in FIG. 15B, or the n-type electrode may be formed on the back surface of the GaN substrate while the optically transparent p-type electrode is formed on the epitaxial outermost surface.

Conditions related to the well layers and the barrier layers included in the emission layer 904 in this Embodiment 11 are similar to those in the case of Embodiment 7.

Figure 16:
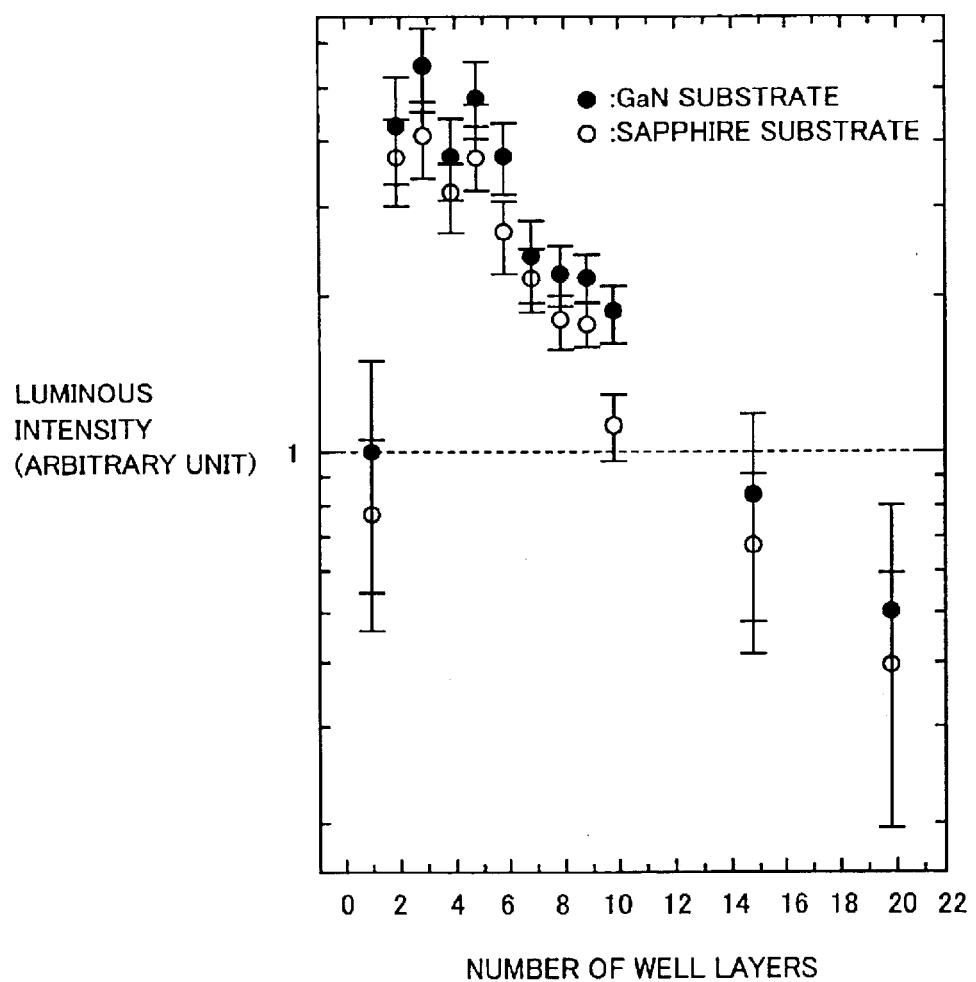
FIG. 16 is a graph showing relation between the number of well layers in light-emitting diode devices according to the present invention and luminous intensities of the devices.

FIG. 16 shows relation between the number of the well layers included in the emission layer of the light-emitting diode device and the luminous intensity. The horizontal axis of this graph shows the numbers of well layers, and the vertical axis shows the luminous intensity (normalized arbitrary unit). In FIG. 16, the luminous intensity is mormalized with reference (broken line) to the case of employing conventional InGaN well layers in place of GaNP well layers (may be well layers of GaNAs or GaNSb). Marks ○ in the graph show luminous intensity values in the case of employing a sapphire substrate, and marks ● show luminous intensity values in the case of employing a GaN substrate. It is understood from this graph that the preferred number of the well layers included in the light-emitting diode is at least 2 and not more than 10. It is also understood that the luminous intensity is rather improved by employing the GaN substrate than the sapphire substrate.

Embodiment 12

Embodiment 12 relates to a nitride semiconductor super-luminescent diode device. Regarding this light-emitting device, its structure and a crystal growth method are similar to those in the case of Embodiment 7 (see FIG. 7). Nitride semiconductor materials for well layers and barrier layers included in an emission layer are similar to those in Embodiment 8. Also in this Embodiment, an effect similar to that of Embodiment 9 is attained by employing a GaN substrate in place of a sapphire substrate, and an effect similar to that of Embodiment 10 is attained by employing the substrate shown in FIG. 14. Relation between the number of the well layers included in the emission layer and the luminous intensity is similar to that in the case of Embodiment 11.

Embodiment 13

In Embodiment 13, C of $1 \times 10^{20}/cm^3$ is added to the well layers and the barrier layers in the emission layer of each of Embodiments 7 and 9 to 11 in place of the impurity Si. Then, a similar effect is attained also by employing C in place of the impurity Si in the well layers and the barrier layers.

Embodiment 14

In Embodiment 14, Mg of $1 \times 10^{16}/cm^3$ is added to the well layers and the barrier layers in the emission layer of each of Embodiments 7 and 9 to 11 as the impurity in place of Si. Then, a similar effect is attained also by employing Mg as the impurity in place of Si in the well layers and the barrier layers.

Embodiment 15

In Embodiment 15, the well layers and the barrier layers included in the emission layer of each of Embodiments 7 and 9 to 11 are changed to $Al_{0.1}Ga_{0.9}N_{0.97}As_{0.01}$ well layers (each thickness: 4 nm)/$In_{0.05}Ga_{0.95}N$ barrier layers (each thickness: 8 nm) of three cycles. Then, an effect similar to that of each of Embodiments 7 and 9 to 11 is attained in Embodiment 15 also.

Embodiment 16

In Embodiment 16, the well layers and the barrier layers included in the emission layer of each of Embodiments 7 and 9 to 11 are changed to $Al_{0.05}Ga_{0.95}As_{0.01}$ well layers (thickness: 2 nm)/GaN barrier layers (thickness: 4 nm) of five cycles. Then, an effect similar to that of each of Embodiments 7 and 9 to 11 is attained in Embodiment 16 also.

Embodiment 17

In Embodiment 17, the well layers and the barrier layers included in the emission layer of each of Embodiments 7 and 9 to 11 are changed to $Al_{0.2}Ga_{0.8}N_{0.96}P_{0.04}$ well layers (thickness: 4 nm)/GaN barrier layers (thickness: 7 nm) of three cycles. Then, an effect similar to that of each of Embodiments 7 and 9 to 11 is attained in Embodiment 17 also.

Embodiment 18

In Embodiment 18, the well layers and the barrier layers included in the emission layer of each of Embodiments 7 and 9 to 11 are changed to $Al_{0.2}Ga_{0.8}N_{0.97}As_{0.03}$ well layers (thickness: 4 nm)/$Al_{0.1}Ga_{0.9}N_{0.99}P_{0.01}$ barrier layers (thickness: 10 nm) of four cycles. Then, an effect similar to that of each of Embodiments 7 and 9 to 11 is attained in Embodiment 18 also.

Embodiment 19

In Embodiment 19, the well layers and the barrier layers included in the emission layer of each of Embodiments 7 and 9 to 11 are changed to $Al_{0.01}Ga_{0.99}N_{0.98}P_{0.02}$ well layers (thickness: 4 nm)/$Al_{0.01}In_{0.06}Ga_{0.93}N$ barrier layers (thickness: 8 nm) of three cycles. Then, an effect similar to that of each of Embodiments 7 and 9 to 11 is attained in Embodiment 19 also.

Embodiment 20

In Embodiment 20, the well layers and the barrier layers included in the emission layer of each of Embodiments 7 and 9 to 11 are changed to $Al_{0.01}Ga_{0.99}N_{0.99}As_{0.01}$ well layers (thickness: 4 nm)/GaN barrier layers (thickness: 3 nm) of six cycles. Then, an effect similar to that of each of Embodiments 7 and 9 to 11 is attained in Embodiment 20 also.

Embodiment 21

In Embodiment 21, the well layers and the barrier layers included in the emission layer of each of Embodiments 7 and 9 to 11 are changed to $Al_{0.03}Ga_{0.97}N_{0.97}P_{0.03}$ well layers (thickness: 6 nm)/$In_{0.1}Al_{0.01}Ga_{0.89}N$ barrier layers (thickness: 3 nm) of four cycles. Then, an effect similar to that of each of Embodiments 7 and 9 to 11 is attained in Embodiment 21 also.

Embodiment 22

In Embodiment 22, the well layers and the barrier layers included in the emission layer of each of Embodiments 7 and 9 to 11 are changed to $Al_{0.03}Ga_{0.97}N_{0.98}As_{0.02}$ well layers (thickness: 4 nm)/$In_{0.01}Ga_{0.99}N_{0.99}As_{0.01}$ barrier layers (thickness: 10 nm) of five cycles. Then, an effect similar to that of each of Embodiments 7 and 9 to 11 is attained in Embodiment 22 also.

Embodiment 23

In Embodiment 23, the well layers and the barrier layers included in the emission layer of each of Embodiments 7 and 9 to 11 are changed to $Al_{0.1}Ga_{0.9}N_{0.97}As_{0.03}$ well layers (thickness: 4 nm)/GaN barrier layers (thickness: 4 nm) of six cycles. Then, an effect similar to that of each of Embodiments 7 and 9 to 11 is attained in Embodiment 23 also.

Embodiment 24

In Embodiment 24, the well layers and the barrier layers included in the emission layer of each of Embodiments 7 and 9 to 11 are changed to $Al_{0.01}Ga_{0.99}N_{0.98}Sb_{0.02}$ well layers (thickness: 5 nm)/GaN barrier layers (thickness: 5 nm) of three cycles. Then, an effect similar to that of each of Embodiments 7 and 9 to 11 is attained in Embodiment 24 also.

Embodiment 25

In Embodiment 25, the well layers and the barrier layers included in the emission layer of each of Embodiments 7 and 9 to 11 are changed to $Al_{0.05}Ga_{0.95}N_{0.93}P_{0.07}$ well layers (thickness: 4 nm)/$In_{0.02}Al_{0.03}Ga_{0.95}N_{0.97}As_{0.03}$ barrier layers (thickness: 8 nm) of four cycles. Then, an effect similar to that of each of Embodiments 7 and 9 to 11 is attained in Embodiment 25 also.

Embodiment 26

In Embodiment 26, the well layers and the barrier layers included in the emission layer of each of Embodiments 7 and 9 to 11 are changed to $Al_{0.05}Ga_{0.95}N_{0.96}As_{0.04}$ well layers (thickness: 15 nm)/$GaN_{0.98}As_{0.02}$ barrier layers (thickness: 10 nm) of three cycles. Then, an effect similar to that of each of Embodiments 7 and 9 to 11 is attained in Embodiment 26 also.

Embodiment 27

In Embodiment 27, the well layers and the barrier layers included in the emission layer of each of Embodiments 7 and 9 to 11 are changed to $Al_{0.01}Ga_{0.99}N_{0.92}P_{0.08}$ well layers (thickness: 5 nm)/$Al_{0.03}Ga_{0.97}N_{0.98}Sb_{0.02}$ barrier layers (thickness: 5 nm) of three cycles. Then, an effect similar to that of each of Embodiments 7 and 9 to 11 is attained in Embodiment 27 also.

Embodiment 28

In Embodiment 28, the well layers and the barrier layers included in the emission layer in each of Embodiments 7 and 9 to 11 are changed to $Al_{0.01}Ga_{0.99}N_{0.95}As_{0.05}$ well layers (thickness: 6 nm)/$In_{0.15}Ga_{0.85}N_{0.98}P_{0.02}$ barrier layers (thickness: 6 nm) of two cycles. Then, an effect similar to that of each of Embodiments 7 and 9 to 11 is attained in Embodiment 28 also.

Embodiment 29

In Embodiment 29, the well layers and the barrier layers included in the emission layer of each of Embodiments 7 and 9 to 11 are changed to $Al_{0.01}Ga_{0.99}N_{0.94}As_{0.06}$ well layers (thickness: 10 nm)/$In_{0.1}Al_{0.1}Ga_{0.8}N_{0.95}As_{0.05}$ barrier layers (thickness: 4 nm) of four cycles. Then an effect similar to that of each of Embodiments 7 and 9 to 11 is attained in Embodiment 29 also.

Embodiment 30

In Embodiment 30, the well layers and the barrier layers included in the emission layer of each of Embodiments 7 and 9 to 11 are changed to $Al_{0.03}Ga_{0.97}N_{0.88}P_{0.12}$ well layers (thickness: 10 nm)/$Al_{0.1}Ga_{0.9}N_{0.93}As_{0.07}$ barrier layers (thickness: 15 nm) of four cycles. Then, an effect similar to that of each of Embodiments 7 and 9 to 11 is attained in Embodiment 30 also.

Embodiment 31

In Embodiment 31, the well layers and the barrier layers included in the emission layer of each of Embodiments 7 and 9 to 11 are changed to $Al_{0.03}Ga_{0.97}N_{0.93}As_{0.07}$ well layers (thickness: 20 nm)/$GaN_{0.9}P_{0.1}$ barrier layers (thickness: 20 nm) of three cycles. Then, an effect similar to that of each of Embodiments 7 and 9 to 11 is attained in Embodiment 31 also.

Embodiment 32

In Embodiment 32, the well layers and the barrier layers included in the emission layer of each of Embodiments 7 and 9 to 11 are changed to $Al_{0.1}Ga_{0.9}N_{0.96}As_{0.04}$ well layers (thickness: 5 nm)/$Al_{0.01}Ga_{0.99}N_{0.99}As_{0.01}$ barrier layers (thickness: 5 nm) of two cycles, and further an n-type $Al_{0.15}Ga_{0.85}N$ shielding layer is employed between an n-type light guide layer and the emission layer without employing a p-type shielding layer between the emission layer and the p-type light guide layer. Then, an effect similar to that of each of Embodiments 7 and 9 to 11 is attained in Embodiment 32 also.

Embodiment 33

In Embodiment 33, an optical device is prepared by utilizing the nitride semiconductor laser according to any of Embodiments 7 to 10. In the optical device utilizing, e.g., a bluish-purple (emission wavelength of 400 to 410 nm) nitride semiconductor laser according to the present invention, the lasing threshold current density is lower as compared with a conventional nitride semiconductor laser, the quantity of spontaneously emitted light included in the laser beam is reduced and then noise light is reduced. Such a laser device, having a high output (50 mW) and capable of stably operating in a high-temperature atmosphere, is suitable for a recording/reproducing optical device for a high-density recording/reproducing optical disk.

Figure 17:
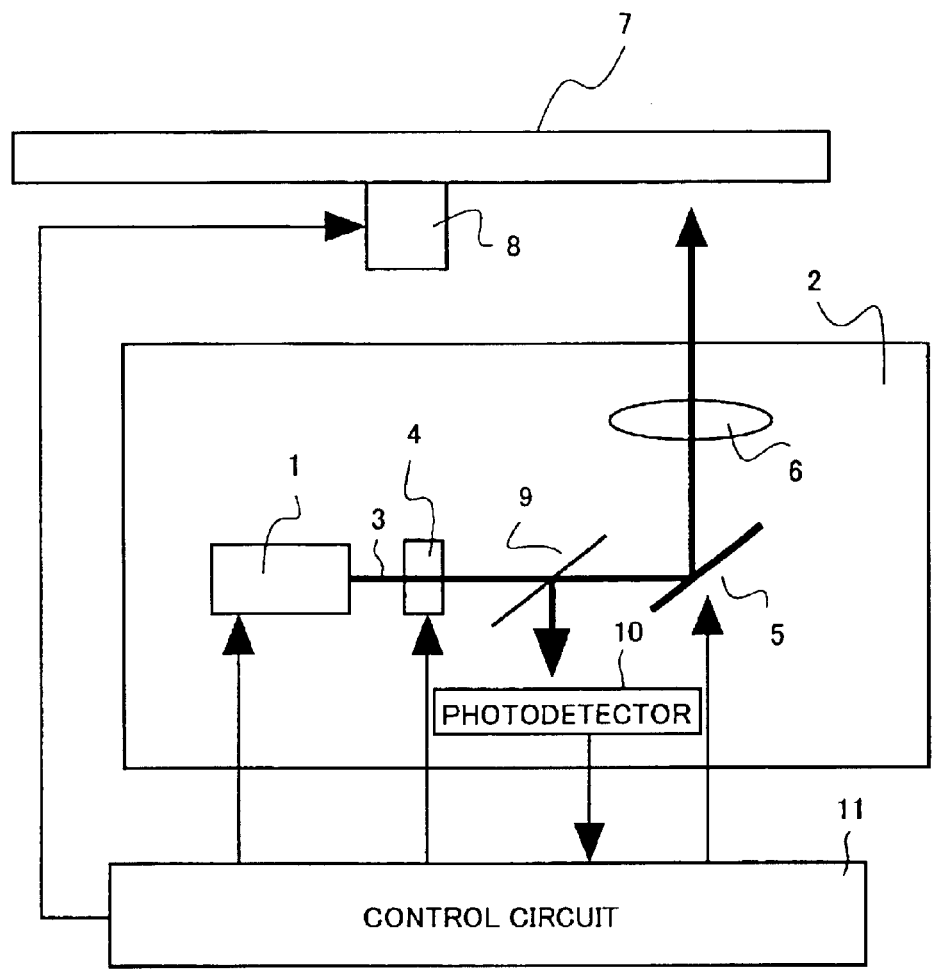
FIG. 17 is a schematic block diagram showing an optical disk recording/reproducing apparatus as an exemplary optical device employing a light-emitting device according to the present invention.

In FIG. 17, as an exemplary optical device including a laser device 1 according to the present invention, an optical disk information recording/reproducing apparatus including an optical pickup 2 is shown in a schematic block diagram. This optical information recording/reproducing apparatus modulates a laser beam 3 in an optical modulator 4 in response to input information and records the information on a disk 7 through a scanning mirror 5 and a lens 6. A motor 8 rotates the disk 7. In reproduction, a detector 10 detects a reflected laser beam optically modulated by pit arrangement on the disk 7 through a beam splitter 9, thereby obtaining a reproduction signal. A control circuit 11 controls the operation of these elements 1, 4, 5, and 8. The output of the laser device 1 is generally 30 mW in recording, and about 5 mW in reproduction.

The laser device according to the present invention is not only employable for the aforementioned optical disk recording/reproducing apparatus, but is also employable for a laser printer, a projector with lasers of the three primary colors (blue, green and red) of light, or the like.

Embodiment 34

In Embodiment 34, the nitride semiconductor light-emitting diode according to each of Embodiments 12 and 13 is utilized for an optical device. For example, it is possible to prepare a white light source including light-emitting diodes or super-luminescent diodes of the three primary colors (red, green, blue) of light employing the emission layers according to the present invention, and it is also possible to prepare a display employing these three primary colors.

When such a white light source utilizing the light-emitting devices according to the present invention is employed in place of a halogen light source employed for a conventional liquid crystal display, it is possible to obtain a backlight having low power consumption and high luminance. In other words, the white light source utilizing the light-emitting devices according to the present invention can be used as a backlight for a liquid crystal display of a man-machine interface in a portable notebook-type computer or a portable telephone, and also enables provision of a miniaturized high-definition liquid crystal display.

Industrial Applicability

According to the present invention as described above, it is possible to provide a nitride semiconductor light-emitting device having high luminous efficiency and an optical device including the same by introducing Al into a quantum well layer of $GaN_{1-x-y-z}As_xP_ySb_z$ ($0<x+y+z\leq 0.3$).

What is claimed is:

1. A nitride semiconductor light-emitting device comprising an emission layer formed on a substrate,
said emission layer including a single quantum well layer of $GaN_{1-x-y-z}As_xP_ySb_z$ ($0<x+y+z\leq 0.3$) containing Al.

2. The nitride semiconductor light-emitting device according to claim 1, wherein a content of said Al is at least $6\times 10^{18}/cm^3$.

3. The nitride semiconductor light-emitting device according to claim 1, wherein said substrate is a nitride semiconductor substrate.

4. The nitride semiconductor light-emitting device according to claim 1, wherein said substrate is a pseudo GaN substrate.

5. The nitride semiconductor light-emitting device according to claim 1, wherein a thickness of said single quantum well layer is in a range of at least 0.4 nm and not more than 20 nm.

6. The nitride semiconductor light-emitting device according to claim 1, wherein said single quantum well layer contains at least one kind of dopant selected from Si, O, S, C, Ge, Zn, Cd and Mg.

7. The nitride semiconductor light-emitting device according to claim 6, wherein a content of said dopant is in a range of $1\times 10^{16}/cm^3$ to $1\times 10^{20}/cm^3$.

8. The nitride semiconductor light-emitting device according to claim 3, wherein the etch pit density of said substrate is not more than $7\times 10^7/cm^2$.

9. An optical device utilizing the nitride semiconductor light-emitting device of claim 1.

10. A nitride semiconductor light-emitting device comprising an emission layer having a multiple quantum well structure obtained by alternately stacking a plurality of quantum well layers and a plurality of barrier layers,
said quantum well layers being formed with $GaN_{1-x-y-z}As_xP_ySb_z$ ($0\leq x\leq 0.10$, $0\leq y\leq 0.16$, $0\leq z\leq 0.04$, $x+y+z>0$) and containing Al,
said barrier layers being formed with a nitride semiconductor.

11. The nitride semiconductor light-emitting device according to claim 10, wherein the Al content in said well layers is at least $1\times 10^{19}/cm^3$.

12. The nitride semiconductor light-emitting device according to claim 10, wherein said barrier layers further contain any element selected from As, P and Sb.

13. The nitride semiconductor light-emitting device according to claim 10, wherein said emission layer includes at least 2 and not more than 10 said well layers.

14. The nitride semiconductor light-emitting device according to claim 10, wherein said well layers have a thickness of at least 0.4 nm and not more than 20 nm.

15. The nitride semiconductor light-emitting device according to claim 10, wherein said barrier layers have a thickness of at least 1 nm and not more than 20 nm.

16. The nitride semiconductor light-emitting device according to claim 10, wherein at least one kind of dopant selected from Si, O, S, C, Ge, Zn, Cd and Mg is added to at least either said well layers or said barrier layers.

17. The nitride semiconductor light-emitting device according to claim 16, wherein a content of said dopant is in a range of $1\times 10^{16}$ to $1\times 10^{20}/cm^3$.

18. The nitride semiconductor light-emitting device according to claim 10, including a substrate for growing a plurality of semiconductor layers included in said nitride semiconductor light-emitting device, wherein at least either a first adjacent semiconductor layer in contact with a first main surface, included in both main surfaces of said emission layer, closer to said substrate or a second adjacent semiconductor layer in contact with a second main surface farther from said substrate is formed with a nitride semiconductor containing Al.

19. The nitride semiconductor light-emitting device according to claim 10, wherein said light-emitting diode is formed using a GaN substrate.

20. An optical device including said nitride semiconductor light-emitting device of claim 10.

21. The nitride semiconductor light-emitting device according to claim 1, further including a first intermediate layer in contact with said emission layer and a n-type GaN layer in contact with this intermediate layer, wherein refractive indices of these layers are increased in order of said emission layer, said first intermediate layer and said n-type GaN layer.

22. The nitride semiconductor light-emitting device according to claim 1, further including a second intermediate layer in contact with said emission layer and a p-type AlGaN carrier blocking layer in contact with this intermediate layer, wherein refractive indices of these layers are increased in order of said emission layer, said second intermediate layer and said p-type AlGaN carrier blocking layer.

23. The nitride semiconductor light-emitting device according to claim 1, further including a carrier blocking layer in contact with a main surface farther from said substrate in both main surfaces of said emission layer, wherein this carrier blocking layer contains Al.

24. The nitride semiconductor light-emitting device according to claim 10, further including a light guide layer in contact with said emission layer, wherein every energy band gap of said barrier layers is small as compared with said light guide layer.

25. A method of manufacturing a nitride semiconductor light-emitting device by growing an emission layer including a quantum well layer of $GaN_{1-x-y-z}As_xP_ySb_z$ ($0<x+y+z\leq0.3$) containing Al and a p-type layer thereon over a substrate, thereafter cooling the substrate to a temperature in a range 650° C. to 900° C. with supply of atmosphere gas containing nitrogen and NH3, and then stopping supply of NH3 with the substrate being held at a temperature within said range.

26. A method of manufacturing a nitride semiconductor light-emitting device including an emission layer including a quantum well layer of $GaN1-x-y-zAsxPySbz$ ($0\leq x\leq0.10$, $0\leq y\leq z\leq0.04$, $0<x+y+z$) containing Al and a barrier layer of a nitride semiconductor over a substrate, characterized in that a growth interruption period in a range of 1 second to 180 seconds is provided between crystal growth of said well layer and crystal growth of said barrier layer.

27. The nitride semiconductor light-emitting device according to claim 10, including a substrate for growing a plurality of semiconductor layers included in said nitride semiconductor light-emitting device and further including a carrier blocking layer in contact with a main surface farther from said substrate in both main surfaces of said emission layer, wherein this carrier blocking layer is formed with a nitride semiconductor containing Al.

* * * * *

UNITED STATES PATENT AND TRADEMARK OFFICE
CERTIFICATE OF CORRECTION

PATENT NO. : 6,858,882 B2
DATED : February 22, 2005
INVENTOR(S) : Yuhzoh Tsuda et al.

It is certified that error appears in the above-identified patent and that said Letters Patent is hereby corrected as shown below:

Column 20,
Line 35, please delete "may be" and replace with -- are preferably --.

Column 21,
Line 55, please delete "TBR" and replace with -- DBR --.
Line 61, please delete "thicknesses" and replace with -- thickness --.

Column 28,
Line 63, please delete "a n-type GaN" and replace with -- an n-type GaN --.

Column 30,
Line 1, please delete "a range 650° C to 900° C." and replace with -- a range 650°C to 900°C --.
Line 8, please delete "($0 \leq x \leq 0.10$, $0 \leq y \leq z \leq 0.04$, $0 < x+y+z$)" and replace with
-- ($0 \leq x \leq 0.10$, $0 \leq y \leq 0.16$, $0 \leq z \leq 0.04$, $0 < x+y+z >$) --.

Signed and Sealed this

Thirtieth Day of August, 2005

JON W. DUDAS
*Director of the United States Patent and Trademark Office*